US008016944B2

(12) United States Patent
Kortshagen et al.

(10) Patent No.: US 8,016,944 B2
(45) Date of Patent: Sep. 13, 2011

(54) PROCESS AND APPARATUS FOR FORMING NANOPARTICLES USING RADIOFREQUENCY PLASMAS

(75) Inventors: Uwe Kortshagen, Roseville, MN (US); Elijah J. Thimsen, Minneapolis, MN (US); Lorenzo Mangolini, Minneapolis, MN (US); Ameya Bapat, Minneapolis, MN (US); David Jurbergs, Austin, TX (US)

(73) Assignee: Regents of the University of Minnesota, Minneapolis, MN (US)

( * ) Notice: Subject to any disclaimer, the term of this patent is extended or adjusted under 35 U.S.C. 154(b) by 79 days.

(21) Appl. No.: 12/263,616

(22) Filed: Nov. 3, 2008

(65) Prior Publication Data

US 2009/0056628 A1 Mar. 5, 2009

Related U.S. Application Data

(62) Division of application No. 11/155,340, filed on Jun. 17, 2005, now Pat. No. 7,446,335.

(60) Provisional application No. 60/581,141, filed on Jun. 18, 2004, provisional application No. 60/623,979, filed on Nov. 1, 2004.

(51) Int. Cl.
*C30B 27/02* (2006.01)
*C30B 21/02* (2006.01)
*C30B 21/04* (2006.01)

(52) U.S. Cl. ......... 117/210; 117/200; 117/205; 117/220

(58) Field of Classification Search ........... 117/200–220
See application file for complete search history.

(56) References Cited

U.S. PATENT DOCUMENTS

| 4,400,409 | A |   | 8/1983  | Izu et al. ................... 427/39     |
|-----------|---|---|---------|------------------------------------------|
| 4,461,237 | A | * | 7/1984  | Hinkel et al. ............... 118/50.1   |
| 4,464,223 | A | * | 8/1984  | Gorin ........................ 438/729   |
| 4,572,759 | A | * | 2/1986  | Benzing ................... 156/345.45   |
| 4,576,698 | A | * | 3/1986  | Gallagher et al. ....... 204/192.32      |
| 4,583,492 | A |   | 4/1986  | Cowher et al. ............. 118/723      |
| 4,585,516 | A | * | 4/1986  | Corn et al. ................. 438/714    |
| 4,673,588 | A | * | 6/1987  | Bringmann et al. ....... 427/489         |
| 4,786,359 | A | * | 11/1988 | Stark et al. ................. 438/710   |
| 5,057,185 | A | * | 10/1991 | Thomas, III et al. ........ 438/710      |
| 5,110,438 | A | * | 5/1992  | Ohmi et al. ............... 204/298.34   |
| 5,686,789 | A |   | 11/1997 | Schoenbach et al. ........ 313/491       |
| 5,695,617 | A |   | 12/1997 | Graiver et al. ........... 204/157.41    |
| 5,698,062 | A | * | 12/1997 | Sakamoto et al. ....... 156/345.44       |
| 5,817,534 | A | * | 10/1998 | Ye et al. ................... 438/10     |
| 5,900,103 | A | * | 5/1999  | Tomoyasu et al. ....... 156/345.44       |

(Continued)

OTHER PUBLICATIONS

Bapat, a., et al., "Synthesis of highly oriented, single-crystal silicon nanoparticles in a low-pressure, inductively coupled plasma," *Journal of Applied Physics* 94(3), Aug. 1, 2003, pp. 1969-1974.

(Continued)

*Primary Examiner* — Bob M Kunemund
*Assistant Examiner* — G. Nagesh Rao
(74) *Attorney, Agent, or Firm* — Westman, Champlin & Kelly, P.A.

(57) ABSTRACT

Methods and apparatus for producing nanoparticles, including single-crystal semiconductor nanoparticles, are provided. The methods include the step of generating a constricted radiofrequency plasma in the presence of a precursor gas containing precursor molecules to form nanoparticles. Single-crystal semiconductor nanoparticles, including photoluminescent silicon nanoparticles, having diameters of no more than 10 nm may be fabricated in accordance with the methods.

16 Claims, 20 Drawing Sheets

U.S. PATENT DOCUMENTS

| | | | | |
|---|---|---|---|---|
| 5,958,329 | A | 9/1999 | Brown | 266/176 |
| 6,155,198 | A * | 12/2000 | Danek et al. | 118/723 E |
| 6,162,709 | A * | 12/2000 | Raoux et al. | 438/513 |
| 6,264,788 | B1 * | 7/2001 | Tomoyasu et al. | 156/345.43 |
| 6,391,147 | B2 * | 5/2002 | Imafuku et al. | 156/345.47 |
| 6,433,480 | B1 | 8/2002 | Stark et al. | 313/631 |
| 6,623,559 | B2 | 9/2003 | Huang | 117/87 |
| 6,688,494 | B2 | 2/2004 | Pozarnsky et al. | 222/4 |
| 6,703,081 | B2 | 3/2004 | Karner et al. | 427/562 |
| 6,991,701 | B2 * | 1/2006 | Takenaka et al. | 156/345.51 |
| 7,223,446 | B2 * | 5/2007 | Ichijo | 427/534 |
| 7,446,335 | B2 * | 11/2008 | Kortshagen et al. | 257/51 |
| 7,491,649 | B2 * | 2/2009 | Bhardwaj et al. | 438/707 |
| 7,569,256 | B2 * | 8/2009 | Ichijo | 427/534 |
| 7,602,127 | B2 * | 10/2009 | Coumou | 315/111.21 |
| 2001/0013313 | A1 | 8/2001 | Droopad et al. | 117/200 |
| 2002/0040765 | A1 | 4/2002 | Suzuki | 156/345.28 |
| 2002/0132045 | A1 | 9/2002 | Hallas et al. | 427/217 |
| 2003/0227737 | A1 * | 12/2003 | Lue | 361/234 |
| 2005/0005851 | A1 | 1/2005 | Keshner et al. | 118/723 |
| 2006/0051505 | A1 * | 3/2006 | Kortshagen et al. | 427/212 |
| 2009/0056628 | A1 * | 3/2009 | Kortshagen et al. | 118/718 |

OTHER PUBLICATIONS

Gorla, C.R., et al., "Silicon and germanium nanoparticle formation in an inductively coupled plasma reactor," *J. Vac. Sci. Technol.* A 15(3), May/Jun. 1997, pp. 860-864.

Lake, M.R., et al., "Properties of Powders Deposited by Silane/Hydrogen and Silane/Methane Plasmas," *Journal of Non-Crystalline Solids*, 109, pp. 318-326; 1989.

Zhang, D., "Visible Light Emission From Silicon Nanoparticles," *Mat. Res. Soc. Symp. Proc.*, vol. 256, pp. 35-40, 1992.

Oda, S., "Frequency effects in processing plasmas of the VHF band," *Plasma Sources Sci. Technol.*, vol. 2, pp. 26-29, 1993.

Costa, J., et al., "Microstructural and Vibrational Characterization of the Hydrogenated Amorphous Silicon Powders," *Mat. Res. Soc. Symp. Proc.*, vol. 297, pp. 1031-1036, 1993.

Liu, X., et al., "Photoluminescence from nanocrystalline embedded in hydrogenated amorphous silicon films prepared by plasma enhanced chemical vapor deposition," *Appl. Phys. Lett.*, vol. 64(2), pp. 220-222, Jan. 10, 1994.

Costa, J., et al., "Preparation of nanoscale amorphous silicon based powder in a square-wave-modulated rf plasma reactor," *Vacuum*, vol. 45, No. 10/11, pp. 1115-1117, 1994.

Bertran, E., et al., "Effects of plasma processing on the microstructural properties of silicon powders," *Plasma Sources Sci. Technol.* 3, pp. 348-354, Jan. 14, 1994.

Costa, J., et al., "Unusual photoluminescence properties in amorphous silicon nanopowder produced by plasma enhanced chemical vapor deposition," *Appl. Phys. Lett.*, vol. 64(4), pp. 463-465, Jan. 24, 1994.

Sansonners, L., et al.., "Synthesis of PbS and $SnO_x$ nanoparticles for functional applications," *J. Phys. D: Appl. Phys.*, vol. 27, pp. 1406-1411, Jul. 14, 1994.

Bossel, C., et al., "Processing of nano-scaled silicon powders to prepare slip cast structural ceramics," *Materials Science and Engineering*, A204, pp. 107-112, 1995.

Otobe, M., et al., "Fabrication of Nanocrystalline Si by $SIH_4$ Plasma Cell," *Mat. Res. Soc. Symp. Proc.*, vol. 377, 1995, published by Materials Research Society.

Otobe, M., et al., "Nanocrystalline silicon formation in a $SiH_4$ plasma cell," *Journal of Non-Crystalline Solids*, 198-200, pp. 875-878, 1996.

I Cabarrocas, P.R., et al., "Experimental evidence for nanoparticle deposition in continuous argon-silane plasmas: Effects of silicon nanoparticles on film properties," *J. Vac. Sci. Technol. A*, vol. 14(2), pp. 655-659, Mar./Apr. 1996.

Oda, S., "Preparation of nanocrystalline silicon quantum dot structure by a digital plasma process," *Advances in Colloid and Interface Science*, 71-72, pp. 31-47, 1997.

Ifuku, T., et al., "Fabrication of Nanocrystalline Silicon with Small Spread of Particle Size by Pulsed Gas Plasma," *Jpn. J. Appl. Phys.*, vol. 36, Part 1, No. 6B, pp. 4031-4034, Jun. 1997.

Oda, S., "Fabrication of silicon quantum dots by pulsed-gas plasma processes and their properties," (Abstract), Int. Symp. Nanostructures: Phys. Technol., St. Petersburg, pp. 23-27, Jun. 1997.

I Cabarrocas, P.R., et al., "Nanoparticle formation in low-pressure silane plasmas: bridging the gap between a-SI:H and µc-Si films," *Journal of Non-Crystalline Solids*, 227-230, pp. 871-875, 1998.

Gorer, S., et al., "Size-Selective and Epitaxial Electrochemical/Chemical Synthesis of Sulfur-Passivated Cadmium Sulfide Nanocrystals on Graphite," *J. Am. Chem. Soc.*, vol. 120, 9584-9593, 1998.

Hofmeister, H., et al., "Structure of nanometersized silicon particles prepared by various gas phase processes," *Journal of Non-Crystalline Solids*, 232-234, pp. 182-187, 1998.

Kortshagen, U.R., et al., "Generation and Growth of Nanoparticles in Low-Pressure Plasmas," *Pure and Applied Chemistry*, vol. 71, p. 1871, 1999.

Shi, W., et al., "Parallel Operation of Microhollow Cathode Discharges," *IEEE Transactions on Plasma Science*, vol. 27, No. 1, pp. 16-17, Feb. 1999.

Oda, S., et al., "Nanocrystalline silicon quantum dots prepared by VHF Plasma-enhanced chemical vapor deposition," *J. Phys. IV France*, vol. 11, Pr3-1065-Pr3-1071, 2001.

Prakash, G., et al., "Nonlinear optical properties of silicon nanocrystals grown by plasma-enhanced chemical vapor deposition," *Journal of Applied Physics*, vol. 91, No. 7, pp. 4607-4610, Apr. 1, 2002.

Viera, G., et al., "Atomic structure of the nanocrystalline Si particles appearing in nanostructured Si thin films produced in low-temperature radiofrequency plasmas," *Journal of Applied Physics*, vol. 92, No. 8, pp. 4684-4694, Jul. 17, 2002.

Shen, Z., et al., "Experimental study of the influence of nanoparticle generation on the electrical characteristics of argon-silane capacitive radio-frequency plasmas," *J. Vac. Sci. Technol. A*, vol. 20(1), pp. 153-159, Jan./Feb. 2002.

I Cabarrocas, P.R., et al., "Plasma Grown Particles: From Injected Gases to Nanoparticles and Nanomaterials, from Injected Particles to Dust Clouds in the PKE Experimental," *AIP Conference Proceedings*, vol. 649(1), pp. 45-52, Dec. 13, 2002.

Vollath, D., et al., "Chapter Eight:: Synthesis of Nanopowders by the Microwave Plasma Process-Basic Considerations and Perspectives for Scaling Up," pp. 219-251 from *Innovative Processing of Films and Nanocrystalline Powders*, ed Kwang-Leong Choy, Imperial College Press, 2002.

I Cabarrocas, P.R., et al., "Plasma production of nanocrystalline silicon particles and polymorphous silicon thin films for large-area electronic devices," *Pure Appl. Chem.*, vol. 74, No. 3, pp. 359-367, 2002.

Shirai, H., et al., "Luminescent silicon nanocrystal dots fabricated by $SiCl_4/H_2$ RF plasma-enhanced chemical vapor deposition," *Physica E*, vol. 16, pp. 388-394, 2003.

Oda, S., "NeoSilicon materials and silicon nanodevices," *Materials Science and Engineering*, B101, pp. 19-23, 2003.

Yu, J., et al., "Structure and Magnetic Properties of $SiO_z$ Coated $Fe_2O_3$ Nanoparticles Synthesized by Chemical Vapor Condensation Process," *Rev. Adv. Mater. Sci.*, vol. 4, pp. 55-59, 2003.

Choi, C., et al., "Preparation and Characterization of Magnetic Fe, Fe/C and Fe/N Nanoparticles Synthesized by Chemical Vapor Condensation Process," *Rev. Adv. Mater. Sci.*, vol. 5, pp. 487-492, 2003.

Park, N., et al., "Size-dependent charge storage in amorphous silicon quantum dots embedded in silicon nitride," *Applied Physics Letters*, vol. 83, No. 5, pp. 1014-1016, Aug. 4, 2003.

Penache, C., et al., "Large Area Surface Modification Induced by Parallel Operated MSE Sustained Glow Discharges," printed from the web at http://hsbpc1.ikf.physik.uni-frankfurt.de/web/publications/files/PenacheH- akone2001.pdf prior to Jun. 18, 2004.

Reboredo, F., et al., "Computational Engineering of the Stability and Optical Gaps of SiC Quantum Dots," *Nano Letters*, vol. 4, No. 5, pp. 801-804, 2004.

International Search Report, PCT/US05/21551, Jan. 23, 2007.

* cited by examiner

PROCESS AND APPARATUS FOR FORMING NANOPARTICLES USING RADIOFREQUENCY PLASMAS

CROSS-REFERENCE TO RELATED APPLICATIONS

This application is a Divisional application of U.S. Application Ser. No. 11/155,340, filed Jun. 17, 2005, which is now U.S. Pat. No. 7,446,335, which claims priority from U.S. Provisional Patent Application Ser. No. 60/581,141, filed Jun. 18, 2004, and from U.S. Provisional Patent Application Ser. No. 60/623,979, filed Nov. 1, 2004, the entire disclosures of which are incorporated herein by reference.

STATEMENT OF GOVERNMENT INTERESTS

This invention was made with United States government support awarded by the National Science Foundation under Grant No. DGE 0114372, CTS-9876224 and DMR 0212302. The United States government has certain rights in this invention.

FIELD OF THE INVENTION

This invention relates to radiofrequency plasma-based processes for use in the production of nanoparticles made from a variety of materials, including semiconductors, and to radiofrequency plasma reactors adapted to produce the nanoparticles.

BACKGROUND

Nanoparticles have recently attracted significant attention from researchers in a variety of disciplines, due to a wide array of potential applications in the fabrication of nanostructured materials and devices. Semiconductor nanoparticles, such as silicon nanoparticles, are of special interest due to their potential uses in photoluminescence-based devices, doped electroluminescent light emitters, memory devices and other microelectronic devices, such as diodes and transistors. Different methods have been used to synthesize free standing silicon nanoparticles. These methods include laser pyrolysis of silane, laser ablation of silicon targets, evaporation of silicon and gas discharge dissociation of silane.

Amorphous and polycrystalline silicon particles can be produced using argon-silane discharges. See for example, U.S. Pat. No. 4,583,492. However such particles are not suitable for many device applications which require single-crystal particles. Single-crystal nanoparticles have higher carrier velocities due to the absence of grain boundaries or defects leading to potentially better performance. Hence a reproducible reliable method for generating monodisperse, single-crystal nanoparticles is highly desirable for device applications.

Recently single-crystal silicon nanoparticles have been made using very-high-frequency (VHF) pulsed gas plasmas. Using these VHF pulsed gas plasmas it has been reported that single nanocrystals of silicon having diameters of about eight nanometers (nm) may be formed. See, for example, Ifuku et al., *Jpn. J. Appl. Phys.*, 36 (1997), 4031-4034.

SUMMARY

Plasma-based methods for producing nanoparticles are provided. The methods include the step of generating a radiofrequency (RF) plasma in the presence of a precursor gas containing precursor molecules. The methods are well suited for the production of single-crystal semiconductor nanoparticles, such as silicon nanoparticles, from precursor molecules, such as silane.

Using the methods provided herein, nanoparticles having a variety of diameters may be fabricated. In some instances the plasma conditions may be tailored to provide single-crystal semiconductor nanoparticles having an average diameter of no more than about 10 nm. Such nanoparticles have been shown to exhibit photoluminescence.

In some embodiments, the nanoparticles include an organic or inorganic passivation layer. The inorganic passivation layer may comprise inorganic materials other than natural oxides of the semiconductor. For example, silicon nanoparticles having a silicon nitride or silicon carbide layer on their outer surface may be produced in accordance with the present methods.

The RF plasma may be generated in a plasma reactor having an electrode assembly that includes two electrodes arranged in a substantially parallel alignment and separated by a gap where at least one of the two electrodes is a ring electrode. Although other electrode geometries and configurations may also be used. Production of nanoparticles may be increased by using a plasma apparatus having multiple plasma chambers operating in parallel. For example, in one such apparatus multiple plasma reactors (e.g., quartz plasma tubes) may be arranged in a substantially parallel arrangement inside a larger vacuum vessel and a separate plasma discharge may be ignited and sustained in each reactor. Alternatively, multiple substantially parallel plasma reactors may be defined by holes through a dielectric medium sandwiched between two electrodes.

Crystalline semiconductor nanoparticles produced in accordance with the present processes and apparatus are suited for use in a wide variety of device applications. Such applications include, but are not limited to, memory devices (e.g., flash memory devices), light emitting devices, including both photo- and electroluminescent devices (e.g., silicon light emitting diodes and lasers), display devices (e.g., organic LEDs), sensors and other microelectronic devices, such as diodes and transistors, including Schottky barrier field effect transistors (FETs). Examples of devices into which the nanoparticles of the present invention may be incorporated are described in U.S. Patent Application Publication No. 2003/0034486 and in U.S. Patent Application No. 60/458,942 entitled, "Light Emitting Ceiling Tile," the entire disclosures of which are hereby incorporated by reference.

DETAILED DESCRIPTION

Figure 1:
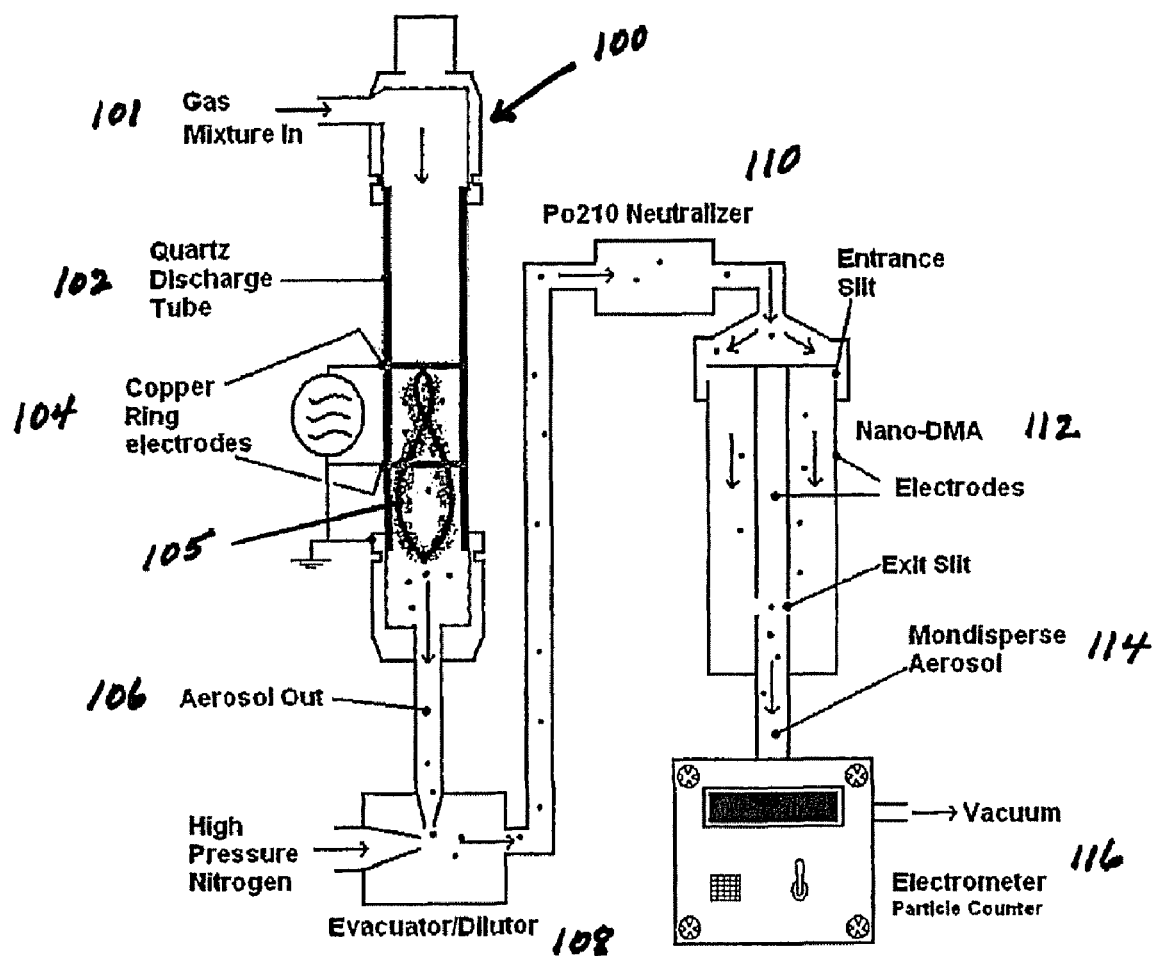
FIG. 1 shows a schematic diagram of an apparatus for producing nanoparticles.

RF plasma-based processes for the fabrication of nanoparticles are provided. Some embodiments of the processes use a constricted RF plasma to produce the nanoparticles. More specifically, these processes utilize an RF plasma operated in a constricted mode to produce nanoparticles from a precursor gas. Although the constricted plasmas may be used to produce nanoparticles composed of a broad range of materials, the process is well-suited for the production of small single-crystal semiconductor nanoparticles. Other embodiments of the processes are capable of producing single crystalline nanoparticles using a RF plasma that is not operated in a constricted mode. As such, the plasma-based processes provided herein are substantially different from more conventional RF plasma-based approaches which utilize stable, uniform plasmas to produce amorphous or polycrystalline semiconductor particles.

The process may be carried out by introducing a precursor gas and, optionally, a buffer gas into a plasma chamber and generating an RF capacitive plasma in the chamber. In certain embodiments the RF plasma is created under pressure and RF power conditions that promote the formation of a plasma instability (i.e., a spatially and temporally strongly non-uniform plasma) which causes a constricted plasma to form in the chamber. The constricted plasma, sometimes also referred to as a contracted plasma, leads to the formation of a high-plasma density filament, sometimes also referred to as a plasma channel. The plasma channel is characterized by a strongly enhanced plasma density, ionization rate, and gas temperature as compared to the surrounding plasma. It can be either stationary or non-stationary. Sometimes periodic rotations of the filament in the discharge tube may be observed, sometimes the filament randomly changes its direction of rotation, trajectory and frequency of rotation. The filament may appear longitudinally non-uniform, sometimes termed striated. In other cases it may be longitudinally uniform. Mechanisms leading to the formation of the filament include, but are not limited to, thermal instabilities, non-linear ionization behavior, and the presence of electron attaching species such as negative ions or particles.

An inert buffer or carrier gas, such as neon, argon, krypton or xenon, may desirably be included with the precursor gas. The inclusion of such gases in the constricted plasma-based methods is particularly desirable since these gases promote the formation of the thermal instability to achieve the thermal constriction. In the RF plasmas, dissociated precursor gas species (i.e., the dissociation products resulting from the dissociation of the precursor molecules) nucleate and grow into nanoparticles.

For illustrative purposes only, much of the discussion that follows describes the methods in the context of crystalline semiconductor nanoparticle formation. However, it should be understood that this discussion, including the processes, processing conditions and apparatus, also apply to the production of other types of nanoparticles, including, but not limited to, metal nanoparticles, metal alloy nanoparticles, metal oxide nanoparticles, metal nitride nanoparticles and ceramic nanoparticles.

Without wishing or intending to be bound to any particular theory of the invention, the inventors believe the formation of a constricted RF plasma promotes crystalline nanoparticle formation because the constricted plasma results in the formation of a high current density current channel (i.e., filament) in which the local degree of ionization, plasma density and gas temperature are much higher than those of ordinary diffuse plasmas which tend to produce amorphous nanoparticles. For example, in some instances gas temperatures of at least about 1000 K with plasma densities of up to about $10^{13}$ $cm^{-3}$ may be achieved in the constricted plasma. Additional effects could lead to further heating of the nanoparticles to temperatures even higher than the gas temperature. These include recombination of plasma electrons and ions at the nanoparticle surface, hydrogen recombination at the particle surface and the condensation heat release related to nanoparticle surface growth. In some instances the nanoparticles may heated to temperatures several hundred degrees Kelvin above the gas temperature. Together, it is believed, these effects lead to the rapid formation of crystalline nanoparticles. These conditions are so well-suited for the production of small crystalline nanoparticles, that the plasma may be continuous, rather than a pulsed plasma.

Thus, some embodiments of the present processes use an RF plasma constriction to provide high gas temperatures using relatively low plasma frequencies. This is advantageous because it allows for the production of crystalline semiconductor nanoparticles using RF plasma equipment which is quite readily available and reasonably priced. In contrast, other plasma processing methods increase the frequency of the discharge (e.g., by using a VHF discharge or a microwave discharge) in order to provide higher plasma densities, which in turn provide higher particle temperatures. Such processes may require the use of less readily available high frequency plasma equipment. In addition, higher frequency plasma processes are typically carried out in a pulsed plasma mode in order to control particle growth rates. In contrast the processes of the present invention may be carried out in a continuous plasma mode, making the present processes more suitable for scaling up to high throughput production.

Conditions that promote the formation of a constricted plasma may be achieved by using sufficiently high RF powers and gas pressures when generating the RF plasma. Any RF power and gas pressures that result in the formation of a constricted RF plasma capable of promoting nanoparticle (e.g., crystalline semiconductor nanoparticles) formation from dissociated precursor gas species may be employed. Appropriate RF power and gas pressure levels may vary somewhat depending upon the plasma reactor geometry. However, in one illustrative embodiment of the processes provided herein, the RF power used to ignite the RF plasma will be at least about 100 Watts and the total pressure in the plasma chamber in the presence of the plasma (i.e., the total plasma pressure) will be at least about 1 Torr. This includes embodiments where the RF power is at least about 110 Watts and further includes embodiments where the RF power is at least about 120 Watts. This also includes embodiments where the total pressure in the plasma chamber in the presence of the plasma is at least about 5 Torr and further includes embodiments where the total pressure in the plasma chamber in the presence of the plasma is at least about 10 Torr (e.g., about 10 to 15 Torr).

Conditions that promote the formation of a non-constricted RF plasmas may be similar to those described above for the production of constricted plasmas, however, nanoparticles are generally formed in the non-constricted plasmas at lower pressures, higher precursor gas flow rates, and lower buffer gas flow rates. For example, in some embodiments nanoparticles (e.g., silicon nanoparticles) are produced in an RF plasma at a total pressure less than about 5 Torr and, desirably, less than about 3 Torr. This includes embodiments where the total pressure in the plasma reactor in the presence of the plasma is about 1 to 3 (e.g., 1.5 to 2) Torr. Typical flow rates for the precursor gas in these embodiments may be at least 5 sccm, including embodiments where the flow rate for the precursor gas is at least about 10 sccm. Typical flow rates for buffer gases in these embodiments may be about 1 to 50 sccm (e.g., about 15 to 25 sccm).

The frequency of the RF voltage used to ignite the radiofrequency plasmas may vary within the RF range. Typically, however, a frequency of 13.56 MHz will be employed because this is the major frequency used in the RF plasma processing industry. However, the frequency will desirably be lower than the microwave frequency range (e.g., lower than about 1 GHz). This includes embodiments where the frequency will desirably be lower than the very high frequency (VHF) range (e.g., lower than about 30 MHz). For example, the present methods may generate radiofrequency plasmas using radiofrequencies of 25 MHz or less.

Using the processes provided herein nanoparticles having very small sizes may be produced. As used herein, the term "nanoparticle" generally refers to particles that have an average diameter of no more than about 100 nm. Nanoparticles have an intermediate size between individual atoms and macroscopic bulk solids. Nanoparticles typically have a size on the order of the Bohr exciton radius (e.g., 4.9 nm for silicon), or the de Broglie wavelength, of the material, which allows individual nanoparticles to trap individual or discrete numbers of charge carriers, either electrons or holes, or excitons, within the particle. The spatial confinement of electrons (or holes) by nanoparticles is believed to alter the physical, optical, electronic, catalytic, optoelectronic and magnetic properties of the material. The alterations of the physical properties of a nanoparticle due to confinement of electrons are generally referred to as quantum confinement effects.

Nanoparticles may exhibit a number of unique electronic, magnetic, catalytic, physical, optoelectronic and optical properties due to quantum confinement effects. For example, many semiconductor nanoparticles exhibit photoluminescence effects that are significantly greater than the photoluminescence effects of macroscopic materials having the same composition. One method for reducing the size of the nanoparticles is to reduce the residence time of the nanoparticles in the RF plasma which reduces the growth time for the nanoparticles.

In some instances, the nanoparticles produced in accordance with the processes provided herein may have an average diameter of no more than about 50 nm. This includes nanoparticles having an average diameter of no more than about 30 nm, further includes nanoparticles having an average diameter of no more than about 10 nm, still further includes nanoparticles having an average diameter of no more than about 5 nm and even further includes nanoparticles having an average diameter of no more than about 2 nm.

In some instances the methods may be used to produce photoluminescent single-crystal semiconductor nanoparticles. For example, photoluminescent single-crystal silicon nanoparticles having a diameter of less than about 5 nm may be produced in accordance with the processes provided herein. The color of the light emitted by these photoluminescent nanoparticles will depend on the size of the nanoparticles, with smaller nanoparticles emitting at higher energies than larger nanoparticles. In some instances the resulting nanoparticles may be freestanding, highly oriented, relatively monodisperse and/or substantially nonagglomerated.

The size of the nanoparticles produced in accordance with the present processes will depend, at least in part, on the residence time of the particles in the plasma, which in turn depends on the flow rate of the precursor gas and the total pressure in the plasma chamber during particle formation. However, the total pressure may also effect the degree of crystallinity of the resulting nanoparticles. Lower total pressures tend to produce smaller particles because they allow for more diffusion losses of precursor molecules and thus lead to a low growth rate of the particles and, therefore, tend to be favored for RF plasma-based processes that do not use constricted plasmas. For the methods that employ RF plasmas, on the other hand, higher total pressures tend to promote the plasma instability and constriction that produces single-crystal particle formation. Thus, for these methods, the total pressures used to create small single-crystal nanoparticles should strike a balance between these considerations.

The inventors have discovered that increased gas flow rates and total plasma reactor pressures may be used to produce nanoparticles, including single-crystal semiconductor (e.g., silicon) nanoparticles, having average diameters of no more than about 10 nm and desirably no more than about 5 nm. For example, in some embodiments of the plasma processes, total gas flow rates of at least 30 standard cubic centimeters (sccm), precursor gas flow rates of at least about 0.01 sccm and total plasma pressures of at least about 1 Torr may be used to produce single-crystal semiconductor nanoparticles having average particle diameters of no more than about 10 nm. This includes embodiments where total gas flow rates of at least about 200 sccm and total plasma pressures of at least about 10 Torr are used and further includes, embodiments where total gas flow rates of at least about 50 sccm, precursor gas flow rates of at least about 1 sccm, and total plasma pressures of at least about 1 Torr are used. In addition, shorter residence times, and thereby smaller nanoparticles, may be achieved by reducing the size of the plasma chamber.

The precursor gas contains precursor molecules that may be dissociated to provide precursor species that form nanoparticles in a RF plasma. Naturally, the nature of the precursor molecules will vary depending upon the type of nanoparticles to be produced. For example, to produce semiconducting nanoparticles, precursor molecules containing semiconductor elements are used. A discussion of some of the various types of nanoparticles that may be produced using RF plasmas in accordance with the present methods, including examples of suitable precursor molecules, is provided below.

The precursor gas is desirably mixed with a buffer gas that acts as a carrier gas and, in some embodiments, helps to provide a plasma constriction. The buffer gas is desirably an inert gas (e.g., a rare gas) with a low thermal conductivity and a high molecular weight (in some instances, higher than that of the precursor molecules). Neon, argon, krypton and xenon are examples of suitable buffer gases. The buffer gas may be characterized in that a non-uniform constricted discharge with a stationary current channel may be formed in the buffer gas alone. This stationary current channel becomes a rotating current channel when the precursor gas is added to the plasma chamber. The frequency of the rotation and, therefore, the residence times of the nanoparticles in the current channel, depends on the flow rate of the precursor gas.

Semiconductor Nanoparticles:

Using the present processes, nanoparticles composed of Group IV, Group IV-IV, Group II-VI and Group III-V elements may be prepared from precursor molecules containing these elements.

The processes provided herein are particularly well-suited for use in the production of single-crystal nanoparticles composed of Group IV semiconductors, including silicon, germanium and tin, from precursor molecules containing these elements. Silane and germane are examples of precursor molecules that may be used in the production of silicon and germanium nanoparticles, respectively. Organometallic precursor molecules may also be used. These molecules include a Group IV metal and organic groups. Organometallic Group IV precursors include, but are not limited to organosilicon, organogermanium and organotin compounds. Some examples of Group IV precursors include, but are not limited to, alkylgermaniums, alkylsilanes, alkylstannanes, chlorosilanes, chlorogermaniums, chlorostannanes, aromatic silanes, aromatic germaniums and aromatic stannanes. Other examples of silicon precursors include, but are not limited to, disilane ($Si_2H_6$), silicon tetrachloride ($SiCl_4$), trichlorosilane ($HSiCl_3$) and dichlorosilane ($H_2SiCl_2$). Still other suitable precursor molecules for use in forming crystalline silicon nanoparticles include alkyl and aromatic silanes, such as dimethylsilane ($H_3C$—$SiH_2$—$CH_3$), tetraethyl silane (($CH_3CH_2)_4$ Si) and diphenylsilane (Ph-$SiH_2$-Ph). In addition to germane, particular examples of germanium precursor molecules that may be used to form crystalline Ge nanoparticles include, but are not limited to, tetraethyl germane (($CH_3CH_2)_4Ge$) and diphenylgermane (Ph-$GeH_2$-Ph).

Group IV-IV nanoparticles may be formed by exposing a precursor gas containing a mixture of one or more Group IV element-containing precursor molecules and one or more different Group IV element-containing precursor molecules, to a plasma to dissociate the precursor molecules into precursor species and exposing the resulting precursor species to a RF plasma to form crystalline Group IV-IV nanoparticles. Examples of Group IV-IV nanoparticles that may be produced in accordance with the present invention include SiC, SiGe and SiSn.

As noted above, crystalline semiconductor nanoparticles that include mixtures of elements from different groups may be formed. One common group of semiconductor materials are the Group II-VI semiconductors. These materials are composed of mixtures of Group II metals and Group VI metals. Group II-VI nanoparticles may be formed by exposing a precursor gas containing a mixture of one or more Group II element-containing precursor molecules and one or more Group VI element-containing precursor molecules to a plasma to dissociate the precursor molecules into precursor species and exposing the resulting precursor species to a RF plasma to form crystalline Group II-VI nanoparticles. Dimethyl cadmium is one example of a suitable Group II organometallic precursor molecule and diphenyldiselenide is one example of a suitable Group VI organometallic precursor.

Group III-V nanoparticles may be formed by exposing a precursor gas containing a mixture of one or more Group III element-containing precursor molecules and one or more Group V element-containing precursor molecules, to a plasma to dissociate the precursor molecules into precursor species and exposing the resulting precursor species to a RF plasma to form crystalline Group III-V nanoparticles. Trimethyl gallium is one example of a suitable Group III organometallic precursor molecule and trimethyl arsenide is one example of a suitable Group V organometallic precursor. In another example, indium-gallium-arsenide nanoparticles may be formed by exposing a precursor gas containing a mixture of gallium-containing precursor molecules (e.g., trimethyl gallium) arsenic-containing precursor molecules (e.g., trimethyl arsenide) and indium-containing precursor molecules (e.g., trimethyl indium) to the RF plasma. Other crystalline nanoparticles that may be formed include, but are not limited to, indium-phosphide, indium-arsenide, and gallium-phosphide nanoparticles.

Nitrides of Group III elements, including gallium nitride, are another example of Group III-V nanoparticles that may be produced. These nitrides may be formed using nitriding agents, such as $NH_3$, $N_2H_4$ and $N_2$, as precursor molecules.

Metal Nanoparticles:

Using the present processes, metal nanoparticles, including nanoparticles composed of Group IIA, IIIA, IVA, VA, IB, IIB, IVB, VB, VIB, VIIB and VIIIB metals, may be prepared from precursor molecules containing these elements. When the present processes are used to produce metal nanoparticles, hydrogen gas may be included as a reducing agent in the precursor gas in order to avoid unwanted oxide formation and to minimize the incorporation of impurities into the nanoparticles.

Suitable metal precursor molecules include metal carbonyls, such as Group VIB metal carbonyls (e.g., $Cr(CO)_6$, $Mo(CO)_6$, $W(CO)_6$ and the like); Group VIIB metal carbonyls (e.g., $Mn_2(CO)_{10}$ and $Re_2(CO)_{10}$); Group VIIIB metal carbonyls (e.g., $Fe(CO)_5$, $Fe_3(CO)_{12}$, $Ru(CO)_5$, $OS(CO)_5$, $H_2Os(CO)_4$, $CO_2(CO)_8$, $[RhCl(CO)_2]_2$, and $Ni(CO)_4$ [gas]). Other metal precursors include metal halide precursors such as Group IVB metal halides (e.g., $TiCl_4$ [liquid] and $TiI_4$); Group VB metal halides (e.g., $VCl_4$ [liquid]); Group VIB metal halides (e.g., $WF_6$ [gas] and $MoF_6$ [liquid]); and Group VIIIB metal halides (e.g., $NiCl_2$).

Organometallic precursors may also be employed. The use of organometallic precursors is advantageous because these precursors allow a wide range of metals to be introduced into the gas-phase. The organic groups of the organometallic precursors are given the following abbreviations: acac=acetylacetonate anion ($CH_3COCHCOCH_3$); hfac=hexafluoroacetylacetonate anion ($CF_3COCHCOCF_3$); thd=2,2,6,6-tetramethylheptane-3,5-dionate ($C_{11}H_{19}O_2$); tfac=trifluoroacetylacetonate anion ($CF_3COCHCOCH_3$); cp=cyclopentadiene anion ($C_5H_5$); cod=1,5-cyclooctadiene ($C_8H_8$). Specific examples of organometallic precursors include Group IIA organometallics (e.g., Mg(bfac)$_2$, Ca(acac)$_2$ and Sr(acac)$_2$); Group IVB organometallics (e.g., Ti(tfac)$_4$ and Hf(tfac)); Group VB organometallics (e.g., V(acac)$_3$); Group VIB organometallics (e.g., Cr(acac)$_3$, Cr(cp)$_2$ and Mo($C_3H_5$)$_4$); Group VIIB organometallics (e.g., Mn(cp)(CO)$_3$); Group VIIIB organometallics (e.g., Fe(tfac)$_3$, Ru(cp)$_2$, Ru(acac)$_3$ Co(acac)$_3$, Rh($C_3H_5$)$_3$, Ir(acac)$_3$, Ir($C_6H_7$)(cod); Pd(acac)$_2$, Pd($C_3H_5$)(hfac), Pt(hfac)$_2$ and Pt(acac)$_2$); Group IB organometallics (e.g., Cu(hfac)$_2$, Ag(cod)(hfac) and Au($CH_3$)$_2$(acac)); Group IIB organometallics (e.g., Zn($CH_3$)$_2$, Zn(acac)$_2$, Cd($C_2H_5$)$_2$ and Hg($CH_3$)$_2$); Group IIIA organometallics (e.g., Al($CH_3$)$_3$, Ga($CH_3$)$_3$, In($CH_3$)$_2$ and In(acac)$_3$); Group IVA organometallics (e.g., Sn($CH_3$)$_4$ and Pb($C_2H_5$)$_4$); and Group VA organometallics (e.g., Bi($C_6H_5$)$_3$).

Metal Alloy Nanoparticles:

Using the present processes, metal alloy nanoparticles may be prepared from precursor molecules containing a combination of metal elements. Thus, metal alloy nanoparticles may be produced in a RF plasma ignited in a mixture of two or more of the metal nanoparticles precursors listed above. For example, a brass alloy (such as cartridge brass), may be produced by incorporating 70% of an appropriate copper precursor, such as Cu(hfac)$_2$, with 30% of an appropriate zinc precursor, such as Zn(acac)$_2$, to produce particles with a composition nominally equivalent to that of cartridge brass (70:30 copper to zinc).

Metal Oxide Nanoparticles:

Using the present processes, metal oxide nanoparticles, including nanoparticles of simple metal oxides (e.g., iron oxide) and mixed metal oxides (e.g., indium tin oxide or strontium titanate ($SrTiO_3$)), may be prepared from precursor gases containing a mixture of metal precursor molecules and one or more oxidizing agents. Oxygen is well-suited for use as an oxidizing agent due to minimization of contamination. However, other oxidizing agents, such as $CO_2$, $NO_2$, NO or $N_2O$ may also be used and are particularly suited for use at high reaction temperatures. Other oxygen bearing gases that are not traditionally considered oxidizing agents may also be used in the plasma provided significant dissociation occurs. A primary example of such an agent is $H_2O$, which may react through both oxidation and hydrolysis reactions in the plasma.

The above-listed metal precursors in combination with oxidizing agents, may produce metal oxide nanoparticles in a RF plasma. Other types of precursors that may be used in the formation of metal oxide particles include metal alkoxides. Metal alkoxides are compounds with —OR groups, where R is an organic group, such as methyl ($CH_3$), ethyl ($C_2H_5$), phenyl ($C_6H_5$), etc. Due to the large number of organic groups, many variants exist. Metal alkoxides exist for Group I through Group IV elements. Some non-limiting examples are Ti(OR)$_4$, VO(OC$_2$H$_5$)$_3$, Al(OC$_4$H$_9$)$_3$, Hf(OC$_2$H$_5$)$_4$, Ni(OC$_2$H$_5$)$_4$, Ta(OCH$_3$)$_5$, Sn(OC$_4$H$_9$)$_4$, and Zr(OC$_2$H$_5$)$_4$.

Metal Nitride Nanoparticles:

Using the present processes, metal nitride nanoparticles, such as titanium nitride nanoparticles, may be prepared from precursor gases containing a mixture of metal precursor molecules and one or more nitriding agents. Examples of nitriding agents include $NH_3$, $N_2H_4$ and $N_2$. When nitrogen gas is used as the nitriding agent, it may be used alone, or in combination with hydrogen gas. Halide and organometallic precursors are examples of precursors that may be used for metal nitride nanoparticle formation. In the halide precursor case, the inclusion of hydrogen in the precursor gas (either added to the gas stream or from the decomposition of a hydrogen-bearing nitriding agent) is desirable.

Ceramic Nanoparticles:

Using the present processes, a wide range of ceramic nanoparticles may be produced. These include the metal oxides listed above and other inorganic oxides (e.g., $B_2O_3$, $SiO_2$, $GeO_2$, and $SnO_2$); the metal nitrides listed above and other inorganic nitrides (e.g., BN, $Si_3N_4$, and $Ge_3N_4$); carbides (e.g., $B_4C$, $Cr_3C_2$, $Mo_2C$, SiC, TaC, TiC, WC, VC, and ZrC); borides (e.g., $CrB_2$, $LaB_6$, $W_2B$, and $TiB_2$); and silicides (e.g., $CrSi_2$, $MoSi_2$, PtSi, $WSi_2$, $ZrSi_2$).

These ceramic nanoparticles may be produced in a RF plasma using mixtures of precursors, oxidizing agents and/or nitriding agents. For example, appropriate precursors for the production of boron-containing ceramics include $BF_3$ (gas), $BCl_3$ (gas), and $B_2H_6$ (gas). Precursors for silicon-containing ceramics (including those already listed elsewhere in this disclosure) include $SiH_4$, $Si_2H_6$, $SiCl_4$, $SiH_2Cl_2$, $SiF_4$, Si($CH_3$)$_4$, and silicon alkoxides (such as Si(OCH$_3$)$_4$ and Si(OC$_2$H$_5$)$_4$). Precursors for germanium-containing ceramics include $GeH_4$, $GeCl_4$, $GeF_4$, Ge($CH_3$)$_4$, and germanium alkoxides (such as Ge(OCH$_3$)$_4$). Precursors for carbon-containing ceramics include many organic molecules in the form of gases or volatile liquids. The simplest example of such is methane ($CH_4$).

Oxide-containing ceramic nanoparticles can be formed by combining the appropriate metal or inorganic precursor or precursors with an oxidizing agent, as described above for metal oxides. Similarly, nitride-containing ceramic nanoparticles can be formed by combining the appropriate metal or inorganic precursor or precursors with a nitriding agent, as described above for metal nitrides. Carbon-containing ceramic nanoparticles can be formed by combining the appropriate metal or inorganic precursor or precursors with a carbon precursor, such as methane, in a RF plasma. In the case of halide precursors, hydrogen may optionally be included in the precursor gas to reduce the precursor in the plasma.

For illustrative purposes, a few reaction mechanisms for the production of various ceramic nanoparticles is presented. For example, carbide nanoparticles may be produced according to the following mechanisms:

$$WF_6+CH_4+H_2 \rightarrow WC+6HF;\ \text{and}$$

$$SiH_4+CH_4 \rightarrow SiC+4H_2$$

Boride nanoparticles can be formed by combining an appropriate metal or inorganic precursor or precursors with a boron precursor, such as $BF_3$, $BCl_3$, or $B_2H_6$, under RF plasma conditions. For example $TiB_2$ nanoparticles may be produced according to the following mechanism:

$$TiCl_4+2BCl_3+5H_2 \rightarrow TiB_2+10HCl$$

Silicide nanoparticles can be formed by combining an appropriate metal or inorganic precursor or precursors with a silicon precursor, such as $SiH_4$, under RF plasma conditions. For example, $WSi_2$ nanoparticles may be produced according to the following mechanism:

$$WF_6+SiH_4+H_2 \rightarrow WSi_2+HF$$

Semiconductor nanoparticles produced in accordance with the present processes may optionally be passivated either by using an organic layer covalently attached to the nanoparticle surface or by growing an inorganic passivation layer on the nanoparticle surface to provide core-shell semiconductor nanoparticles. These passivation layers may play an important role in preventing reactive degradation of the nanoparticles when exposed to water and oxygen or other chemical contaminants. Photoluminescent semiconductor nanoparticles passivated with thin layers (e.g., monolayers) of these passivating agents may emit with relatively short (e.g., nanosecond scale or even sub-picosecond scale) lifetimes and high quantum yields. Examples of organic passivating agents that may be used to passivate the surfaces include, but are not limited to, alkenes, alkynes, alcohols, alkoxides, carboxylic acids, carboxylates, silanols, silanolates, phosphines, phosphine oxides, phosphates, amines, thiols, thioethers, disulfides, and sulfoxides. Examples of inorganic materials that may be used as passivation layers include, but are not limited to, silicon containing materials, such as silicon nitride, silicon dioxide, and amorphous hydrogenated silicon carbide; Group II/VI materials such as ZnS, ZnO, and MgO; Group III/V materials such as BN and AlN; metal oxides, such as alumina, titanium dioxide, zirconium dioxide, strontium titanate, and yttrium aluminum garnet; and diamond. Core-shell nanoparticles having a Si core and a ZnS shell are one specific example of core-shell nanoparticles that may be made in accordance with the present methods.

Organic passivation of nanoparticles produced in the plasma may be accomplished by exposing the nanoparticles to the passivating agents under appropriate conditions after the nanoparticles have exited the plasma reaction region. Since most organic passivating agents cannot survive the conditions of the plasma, it is generally desirable that the organic passivation be performed in a subsequent step to avoid decomposition of the passivating agents. This subsequent passivation step may be carried out in a continuous flow process or a batch process, depending upon the configuration of the reaction system.

One method of passivating the nanoparticles with an organic passivation layer is to introduce a gas-phase passivating agent into the aerosol gas stream. The reaction between the passivating agent and the surface of the nanoparticle may be mediated by thermal energy, for example by flowing the combined gas stream through a heated region, or it may be catalyzed by another reagent, for example a gas-phase Lewis acid or other catalytic agent. Another method for passivating the nanoparticles with organic passivation layers (e.g., organic monolayers) can be performed by capturing the nanoparticles in a liquid which is a suitable solvent for the organic passivating agent. Examples of such solvents include, but are not limited to, alkanes, such as hexane; simple arylenes, such as benzene and toluene; ethers, such as diethylether and tetrahydrofuran; ketones, such as acetone; alcohols, such as ethanol, isopropanol and octanol; halogenated organics, such as chloroform, chlorobenzene and trichloroethylene; coordinating solvents, such as trioctylphosphine oxide, dimethylsulfoxide, or octylamine. The nanoparticles may be captured in liquid by bubbling the aerosol through the liquid or by depositing the nanoparticles onto a substrate and immersing the substrate in the liquid. In the later case, stirring or ultrasonic agitation may be employed to disperse the nanoparticles into the liquid. After transferring the nanoparticles into an appropriate liquid, reactions with organic passivating agents can be performed. A wide range of chemical reactions may be employed to derivatize the surface of the semiconductor particles. Descriptions of such reactions may be found in J. M. Buriak, *Chemical Reviews* 102(5), pp. 1271-1308 (2002), describing silicon and germanium surface derivatization and Peng, et. al. U.S. Patent Application Publication No. 2002/0066401 A1, describing derivatization of Group II/VI surfaces, the entire disclosures of which are incorporated herein by reference.

Core-shell nanoparticles composed of a nanoparticle core and an inorganic passivating shell may be fabricated using a double plasma reactor process in which two plasma reactors are connected in series. The core nanoparticles are produced in the first of the two reactors using a RF plasma, which may be a constricted RF plasma, as described above. The nanoparticles so produced are then injected into the second plasma reactor along with a gas containing passivation precursor molecules under conditions that promote the dissociation of the shell precursor molecules. In some embodiments the shell precursor molecules may be pre-dissociated before they are introduced into the second reactor. For example, a gas containing nitrogen and silane may be used to form a silicon nitride passivation layer on a semiconductor (e.g., Si) nanoparticle. A gas containing methane and silane may be used to form a silicon carbide passivation layer. Other passivation precursor gases may be used to produce alternate types of inorganic passivation layers. Many of these gases are already employed in thin film deposition systems, such as chemical vapor deposition (CVD) systems, and are known to those skilled in the art.

During the double reactor production of the inorganically passivated nanoparticles, the pressure in the second plasma reactor will typically be lower than in the first plasma reactor. For example, when a total plasma pressure of 10 Torr is used to form the core nanoparticles, the total gas pressure during the formation of the shell may be between 5-10 Torr, and the partial pressure of the gas containing the passivation precursor molecules may be between 10-200 mTorr depending on the desired properties of the passivation layer. Typical residence times are between 0.1 and 1 seconds and typical RF powers are between 100 and 300 W. Secondary plasmas, such RF or DC glow plasmas, inductively coupled RF plasmas, microwave sustained plasmas, or any kind of sputtering plasma such as DC or RF magnetron plasmas may also be used to produce the passivating shell layers. In some embodiments, the range of parameters for these plasmas encompasses total gas pressures from 10 mTorr to 10 Torr, precursor partial pressures from 1 mTorr to 1 Torr, and RF or DC powers from 5 Watt to 3 kW.

In an alternative embodiments, core-shell nanoparticles composed of a nanoparticle core and an inorganic passivating shell may be fabricated using a double reactor process in which a plasma reactor is connected in series with a gas-phase reactor. Again, the core nanoparticles are produced in the plasma reactor using a RF plasma, which may be a constricted RF plasma, as described above. The nanoparticles so produced may then be injected into the gas-phase reactor where an epitaxial shell may be grown on the nanoparticles by gas condensation.

In one embodiment, a shell may be grown by introducing the nanoparticles produced in the plasma reactor and a precursor vapor into the gas-phase reactor under conditions that promote the decomposition of the precursor vapor molecules followed by the condensation of the decomposed species on the nanoparticles. Typically the precursor vapor is delivered into the reactor by an inert carrier gas, such as helium or argon. A reactive gas may be fed into the gas-phase reactor along with the precursor vapor and the carrier gas. For example, an organometallic precursor vapor may be introduced along with oxygen in an inert carrier gas in order to provide a metal oxide passivating shell. Alternatively, as in the case of a metal shell, a metal vapor may be introduced into the gas-phase reactor from an evaporation source such that the resulting vapor-phase metal atoms condense on the nanoparticles to provide a metal shell. Optionally, a reactive gas, such as oxygen or nitrogen, may be introduced with the metal vapor to provide, for example, a metal oxide or metal nitride shell. Suitable vapor sources include, but are not limited to, resistive heating vapor sources and electron beam vapor sources.

The growth of the shell in the gas phase will generally take place at low pressures (e.g., pressures less than atmospheric pressure) and elevated temperatures. For example, in some illustrative embodiments, the pressure in the gas-phase reactor may be maintained at about $10^{-1}$ to $10^{-4}$ Torr and temperatures of at least about 300° C. Gas-phase synthesis of the nanoparticle shells may be particularly desirable where agglomeration of nanoparticles in a double plasma reactor system is a problem.

In yet other embodiments, core-shell particles may be formed in a single step plasma process using a mixture of two or more precursor gases. Two processes may lead to the formation of core-shell particles. In the first process the partial pressure of a first precursor gas "A" is adjusted such that the precursor molecules in that gas are more amenable to particle nucleation than those of a second precursor gas "B", and the formation of particles from A precursor molecules is thermodynamically favored over the formation of compound particles ("AB" particles) from A and B precursor molecules. These conditions lead to the initial nucleation of small particles (nuclei) from dissociated precursor species of the A molecules. On the surface of these particles a shell forms through condensation of precursor species from the B molecules or through condensation of the compound material AB. For example, a mixture of silane and methane may be introduced into a plasma reactor. Silane forms particles much more readily than methane. Hence these conditions lead to the nucleation of silicon particles which are then coated by either a carbon or silicon carbide film, depending on the ratio of the precursor gases used. Exemplary conditions for this process would include: total plasma pressure of about 1 to 5 Torr; Silane ($SiH_4$:He—5%:95%) flow rate of about 10 sccm, methane ($CH_4$:Ar—5%:95%) flow rate of about 40 sccm, and plasma power of 200 W. However, the present invention is not limited to processes conducted under these conditions.

In the second process, use of two precursor gases "A" and "B" initially leads to the formation of particles of a compound material "AB". If the composition of the AB particles is nonstoichiometric, a phase segregation will occur under a sufficiently high temperature, leading to formation of an A core in an AB shell. In some embodiments the sufficiently high temperature is achieved under the conditions of the plasma in which precursor dissociation occurs. However, suitable thermal conditions for promoting phase segregation may also be achieved by heating the nanoparticles in a furnace, heating the nanoparticles with a laser, depositing the nanoparticles on a heated substrate, heating the nanoparticles with infrared radiation or heating the nanoparticles in a liquid or supercritical fluid environment. Thus, the phase segregation could be performed either in flight in the gas phase, after deposition onto a solid substrate, or after collection in a liquid or fluid. An example of this process would be the formation of silicon core particles with a silicon nitride shell. The particles initially formed in the plasma are a silicon-rich silicon nitride. At particle temperatures significantly above 300° C. in the plasma, a phase segregation will occur which leads to the formation of a silicon core particle with a silicon nitride shell of reduced silicon content as compared to the initial silicon nitride particle. Exemplary conditions for this process would include: Silane flow rate of about 10 sccm (or correspondingly higher if silane is diluted in a carrier gas), nitrogen flow rate of 100 to 800 sccm, and plasma power of 300 W. However, the present invention is not limited to processes conducted under these conditions.

In some instances, nanoparticles having both an inorganic shell and an organic passivating layer may be produced. For example, a nanoparticle core with an inorganic shell may be produced in accordance with the methods described herein (e.g., in a double plasma or a serial plasma/gas-phase reactor system) and the resulting nanoparticles may then be exposed to liquid phase organic passivating agents to provide a protective organic layer over the inorganic shell.

Figure 11:
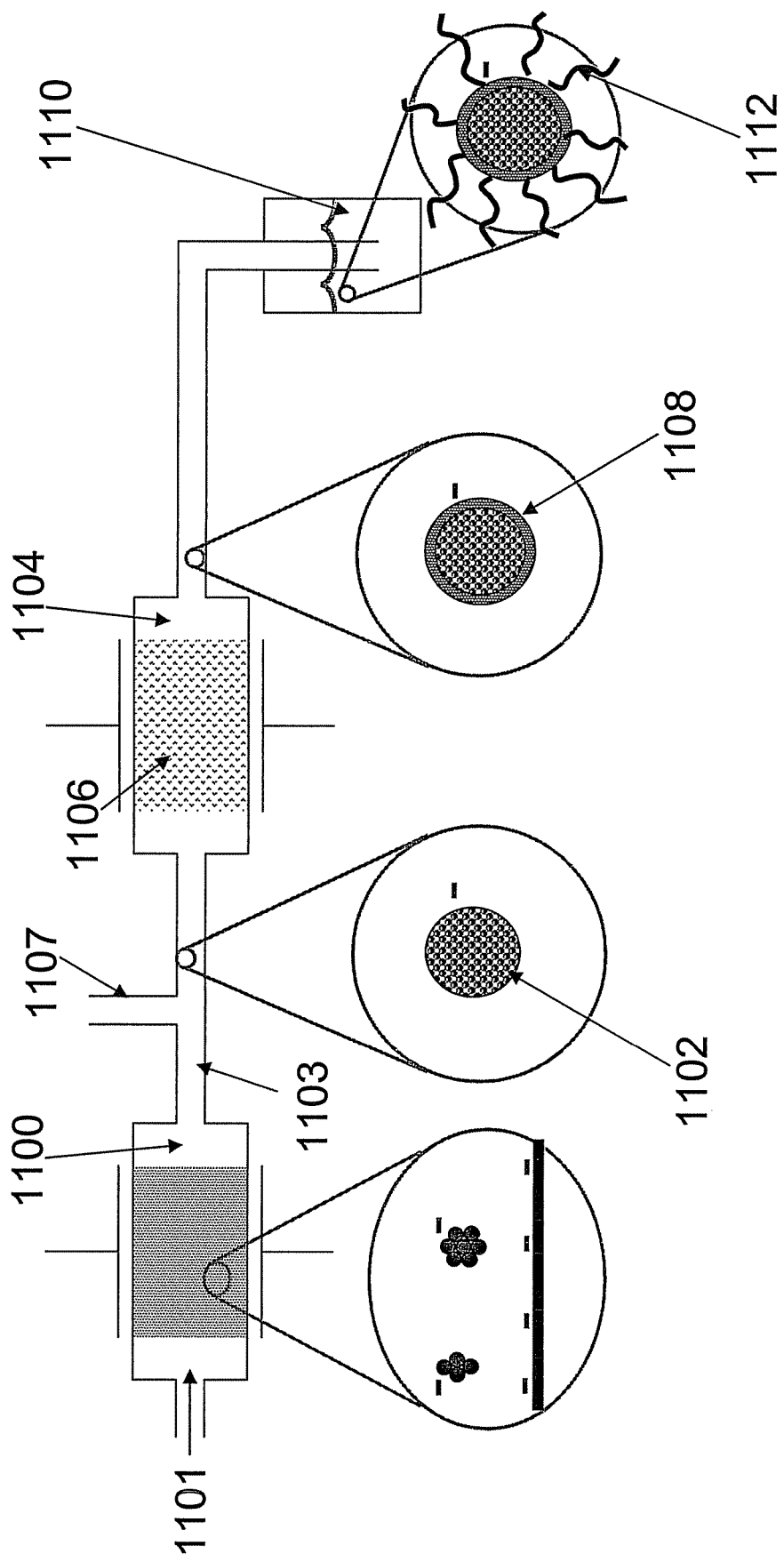
FIG. 11 is a schematic diagram of a three-phase plasma apparatus that includes three reaction chambers in series. The first chamber is a plasma reactor, the second chamber may be either a plasma or gas-phase reactor and the third reactor is a liquid phase reactor.

FIG. 11 shows a schematic diagram of a three phase system for making passivated nanoparticles. In the first phase, plasma precursor molecules, in this case $SiH_4$ molecules, are passed through a core precursor gas injection port 1101 into a first plasma reactor 1100 where a radiofrequency plasma (e.g., a constricted RF plasma) is ignited to form crystalline nanoparticles 1102. These nanoparticles are then passed through connecting tubing 1103 into a second reactor 1104 along with a passivation precursor 1106, introduced upstream of the second reactor through a shell precursor gas injection port 1107, and an inorganic passivating shell 1108 is grown on the nanoparticles. The second reactor may be either a plasma or a gas-phase reactor. In a third phase, the resulting core-shell nanoparticles are then passed into a solvent 1110 containing organic passivating agents 1112 to provide an organic protective shell on the inorganic core-shell nanoparticles. In one embodiment of the system of FIG. 11, the first and second plasma reactors have a length of about 12 cm, the inside diameter of the first plasma reactor is about 0.25 in. and the inside diameter of the second reactor is about 1 inch.

Figure 20:
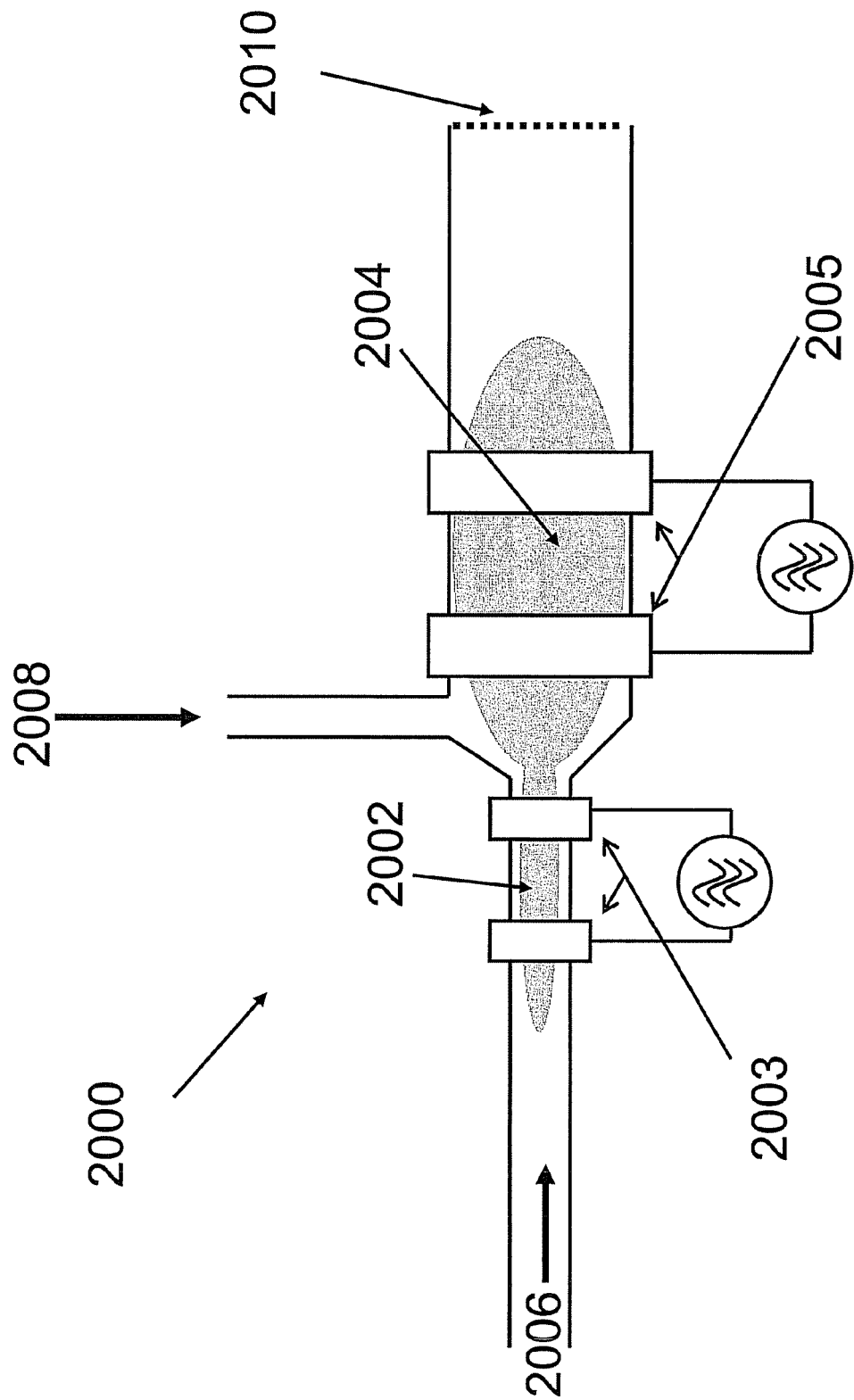
FIG. 20 is a schematic diagram of a two-phase plasma apparatus that includes two reaction chambers in series.

An alternative embodiment of the first and second plasma reactors is shown in FIG. 20. In this system 2000, the connecting tubing 1103 is eliminated and the first plasma reactor 2002, including a pair of ring electrodes 2003 and the second plasma reactor 2004, including a pair of ring electrodes 2005 are immediately adjacent, such that the plasma reaction zones overlap. As before, the core precursor gas may be introduced into the first plasma reactor 2002 through a core precursor gas injection port 2006 and the shell precursor gas may be injected through a shell precursor gas injection port 2008. In the embodiment depicted in FIG. 20, the nanoparticles are collected on a collection mesh 2010 located in or downstream of the second plasma reactor 2004.

Nanoparticles disposed on a substrate and coated with a passivating film may also be formed by a plasma process in which the nanoparticles are produced in a first stage and the inorganic passivating film is formed over the nanoparticles in a second stage. In this case, the nanoparticles are typically prepared in a batch fashion, in which the nanoparticles are first formed in an RF plasma, as described above, then collected in an appropriate manner, such as on substrate, and treated with a second plasma or a vapor containing passivation precursor molecules. Various suitable means for collecting the nanoparticles are known. These include, but are not limited to, collection by thermophoresis on a cold surface, mechanical filtration and electrostatic collection.

If the passivating film is formed from gas-phase (i.e., non-plasma) precursors, a precursor vapor containing precursor species and, optionally, a reactive gas may be introduced into the chamber under conditions which promote the condensation of the precursor species into a passivating film over the nanoparticles. For example, CdS nanoparticles deposited onto a substrate may be coated with a protective sulfur layer by passing a heated (e.g., to 300° C. or higher) gas of $H_2S$ over the substrate under conditions in which the $H_2S$ decomposes and sulfur is deposited on the nanoparticles.

If a second plasma is used to provide the passivating film, a plasma source gas containing inorganic precursor molecules is introduced into the reactor. This second plasma is used to overcoat the nanoparticles with an appropriate inorganic passivating material. There are at least two approaches for forming a passivating film over nanoparticles disposed on a substrate using a double plasma technique. In a first approach a passivating film is deposited onto the nanoparticles by producing a plasma discharge in a gas containing one or more passivation precursor species to dissociate the precursor molecules. For example, silicon nanoparticles may be deposited onto a substrate and at least partially covered by a film of an inorganic passivating material such as amorphous silicon, amorphous silicon oxide, amorphous silicon carbide or amorphous silicon nitride. This may be accomplished by exposing the nanoparticles to a plasma ignited in a gas containing a mixture of passivation precursor molecules, such as silane or disilane and oxygen, methane, nitrogen or ammonia. The passivating film is deposited on the nanoparticles by dissociating these precursor molecules in the plasma.

In a second approach to forming a passivating film over nanoparticles on a substrate, a passivating film is formed by creating a plasma discharge in a gas containing one or more passivation precursor molecules to create reactive species, such as ions and radicals, in the plasma. A passivating film is formed over the nanoparticles by reactions of the nanoparticles with the reactive species from the plasma. For example, silicon nanoparticles may be exposed to a nitrogen or oxygen plasma. The nitrogen and oxygen radicals and ions will react with the silicon at the nanoparticle surface to form a passivating film of silicon nitride or silicon oxide.

During the production of nanoparticles on a substrate that are passivated by an inorganic film, the plasma may be sustained either by DC or RF power, and excitation mechanisms such as capacitively coupled RF, inductively coupled RF, or microwave excitation can be used. Precursor pressures are typically between 1 mTorr and 1 Torr, total gas pressures between 5 mTorr and 10 Torr, and RF or DC powers between 2 Watts and several hundreds of Watts. The substrate temperature may be varied over a wide range, but is typically between room temperature and about 1000° C.

The nanoparticles may be deposited on a variety of substrates, including both organic and inorganic substrates. Deposition may take place prior to coating the nanoparticles with a passivating shell, as described above, or after the core-shell structures have been formed. The nanoparticles exiting the plasma and/or gas-phase reactors may be deposited onto a substrate by passing the stream of nanoparticles over the substrate and allowing the nanoparticles to become affixed to the substrate by, for example, electrostatic attraction or inertial impaction. In some such embodiments the substrate is a continuously moving substrate. In this embodiment the substrate may be provided as a sheet of flexible material suspended between two rolls wherein the sheet is dispensed from the first roll and collected onto the second roll after nanoparticle deposition. Because the plasma-produced nanoparticles are characterized by charged surfaces, they are well adapted for thin film deposition. This is because the surface charges on the nanoparticles cause them to repel one another, resulting is a thin (e.g., single) layer of nanoparticles on the substrate rather than an uneven distribution of nanoparticle agglomerates on the surface. In addition, because the nanoparticles are so small, they may be suspended in a relatively low density gas flow, making it easier, relative to larger particles, to deliver a stream of the nanoparticles to a substrate.

In embodiments where nanoparticles cores are first deposited onto a substrate and subsequently coated with a passivating layer, the deposition may take place in a two-step process where each step takes place at a different location in the system. In one such embodiment, a moving substrate sheet (e.g., a sheet fed from a roll of substrate) crosses in front of the outlet of a plasma reactor where nanoparticle cores collect on the substrate. The substrate then passes through a second reactor, which may be either another plasma reactor or a gas-phase reactor as discussed above, where a passivating film is grown over the nanoparticles. In this embodiment, the substrate sheet may move in a continuous or a step-wise fashion. A roller system suitable for use in the present methods is described in U.S. Pat. No. 4,400,409, the entire disclosure of which is incorporated herein by reference.

Suitable substrates include both inorganic and organic substrates. The substrates may be flexible or non-flexible. Flexible polymer substrates are particularly well-adapted for use in systems that employ a continuously moving substrate. Suitable inorganic substrates include semiconductor, glass and ceramic substrates including but not limited to, silicon, quartz or pyrex and alumina substrates. Webs, such as aluminum or stainless steel webs, may also be used.

Figure 12:
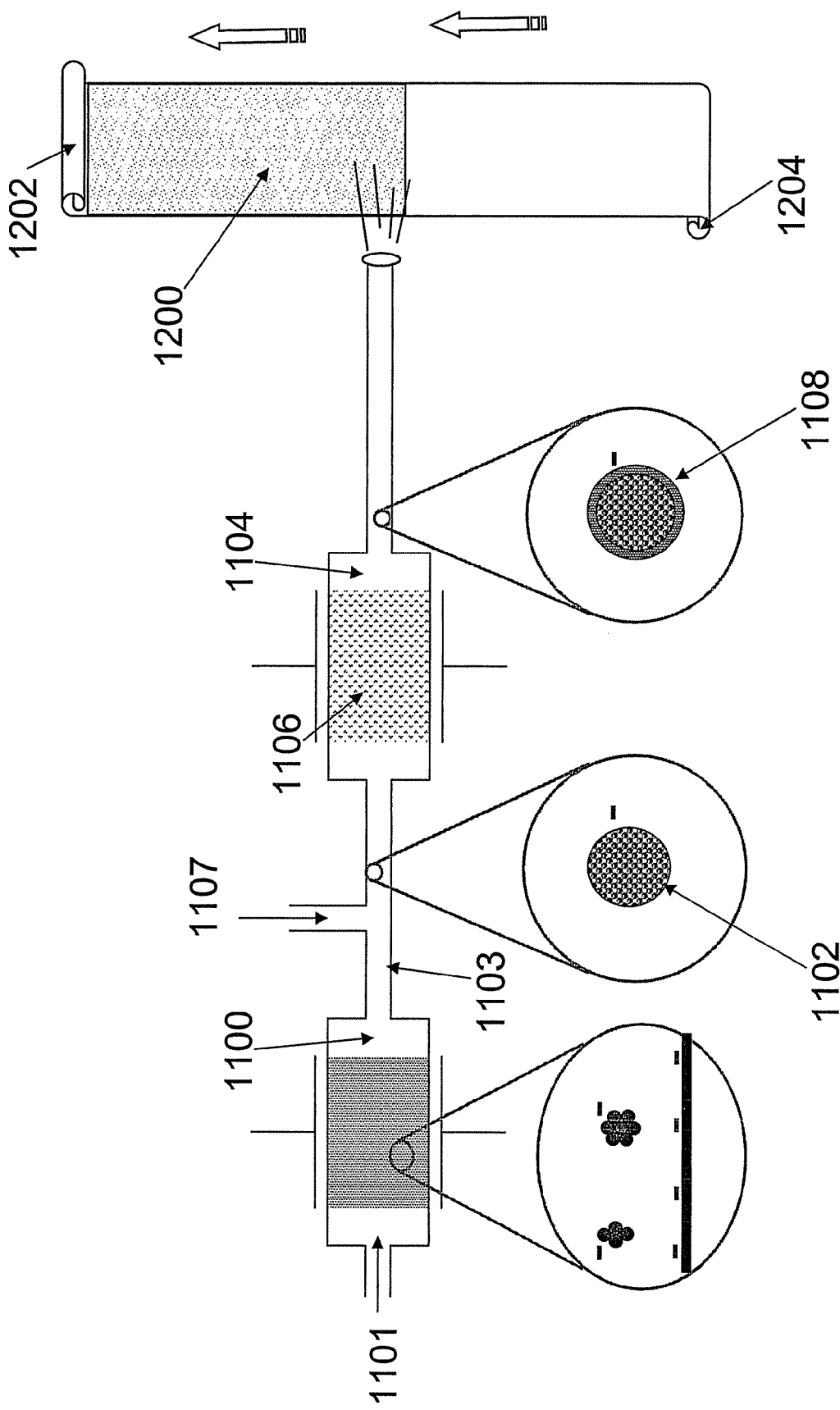
FIG. 12 is a schematic diagram showing the apparatus of FIG. 11 where the third reactor has been replaced by a moving substrate.

FIG. 12 shows a schematic diagram of a system that may be used for the continuous deposition of nanoparticles on a flexible substrate using a roll-to-roll substrate feed mechanism. This system is the same as that of FIG. 11, described above, until the core-shell nanoparticles exit the second reactor. Upon exiting the second reactor however, the nanoparticles are shot out toward a continuously moving substrate 1200 suspended between two rotating rollers 1202, 1204, rather than being directed into a solvent.

Any plasma reactor apparatus capable of producing a RF plasma (or in the case of the constricted plasma-based methods, capable of producing a constricted RF plasma) may be used to carry out the processes provided herein. However, the reactors are desirably flow-through reactors because these allow for high mass throughput. In such reactors reactants flow in through an inlet, nanoparticles are produced in a reaction chamber and the nanoparticles flow out, generally as an aerosol, through an outlet. One illustrative example of a suitable plasma reactor apparatus is shown in FIG. 1. The apparatus 100 includes an inlet port in fluid communication with a plasma chamber 102. As shown in the figure the plasma chamber 102 may take the form of a discharge tube such as a quartz discharge tube having a narrow inside diameter. An electrode assembly 104 is situated in or around the plasma chamber 102. When an RF voltage is applied across the electrodes in the electrode assembly 104 in the presence of a precursor gas, a constricted plasma 105 may be formed in the plasma chamber 102. Nanoparticles 106 formed in the constricted plasma 105 are passed out of the plasma chamber 102 in the form of an aerosol. In some embodiments, the apparatus includes an outlet port. The outlet port may be a small aperture separating the plasma chamber 102 from a downstream chamber (not shown) having a much lower internal pressure. Using this design, a jet containing the nanoparticles may be formed downstream of the aperture. The nanoparticles in the jet may then be accelerated and deposited onto a substrate (e.g., a TEM grid) housed within the downstream chamber. Optionally the apparatus 100 may be equipped with an evacuator/diluter 108 in fluid communication with the plasma chamber 102. The evacuator/diluter 108 may be used to bring the aerosol exiting the plasma chamber 102 up to atmospheric pressure. In the embodiment depicted in FIG. 1, the apparatus also includes a neutralizer 110 in fluid communication with the evacuator/diluter 108. The aerosol exiting the evacuator/diluter 108 may be passed into the neutralizer 110 in order to impart a well defined charge distribution to the aerosol by charging the nanoparticles with radiation from a suitable radioactive source, such as polonium. The particles from the neutralizer 110 may then be fed into a Differential Mobility Analyzer (DMA) 112 which measures the size distribution of the nanoparticles. The nanoparticles may flow from the DMA 112 into a particle counter 116 which is in fluid communication with the DMA 112. A description of a DMA that may be used to characterized the nanoparticles may be found in "A Nanometer Aerosol Size Analyzer for Rapid Measurement of High Concentration Size Distributions," *Journal of Nanoparticle Research*, 2, 43-52 (2000), the entire disclosure of which is incorporated herein by reference.

Figure 2:
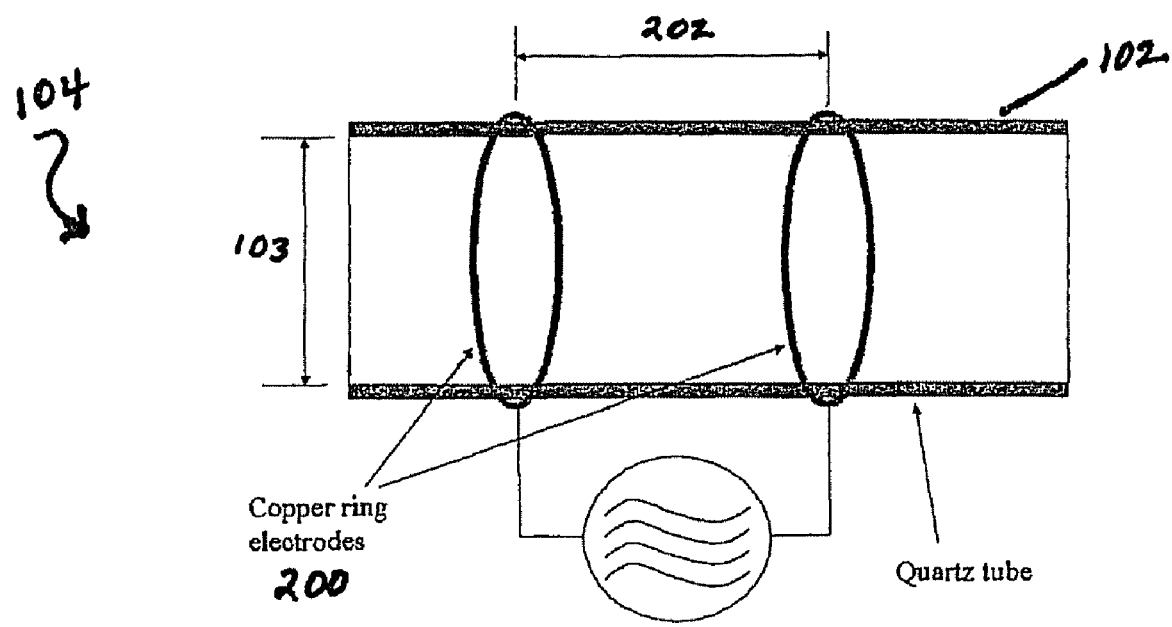
FIG. 2 shows a schematic diagram of the electrode assembly used in the apparatus FIG. 1.

FIG. 2 shows a more detailed view of the electrode assembly of the apparatus of FIG. 1. The electrode assembly 104 includes a pair of ring electrodes 200 surrounding the plasma chamber 102. The ring electrodes 200 are disposed in a generally parallel arrangement and separated by a small gap 200. In one exemplary embodiment of the electrode assembly 104, the ring electrodes 200 are copper electrodes separated by approximately 0.5 inches. In the electrode assembly one of the two ring electrodes serves as an RF powered electrode and the other ring electrode provides a ground electrode. As discussed above when an RF voltage is applied to the RF powered electrode in the presence of a precursor gas, a RF plasma discharge may be generated between the two ring electrodes 200. In an alternative embodiment of the electrode assembly depicted in FIG. 2, only one of the electrodes (e.g., the RF powered electrode) is a ring electrode while the other electrode (e.g., the ground electrode) is a plate electrode. However, other electrode configurations may be employed.

Figure 13:
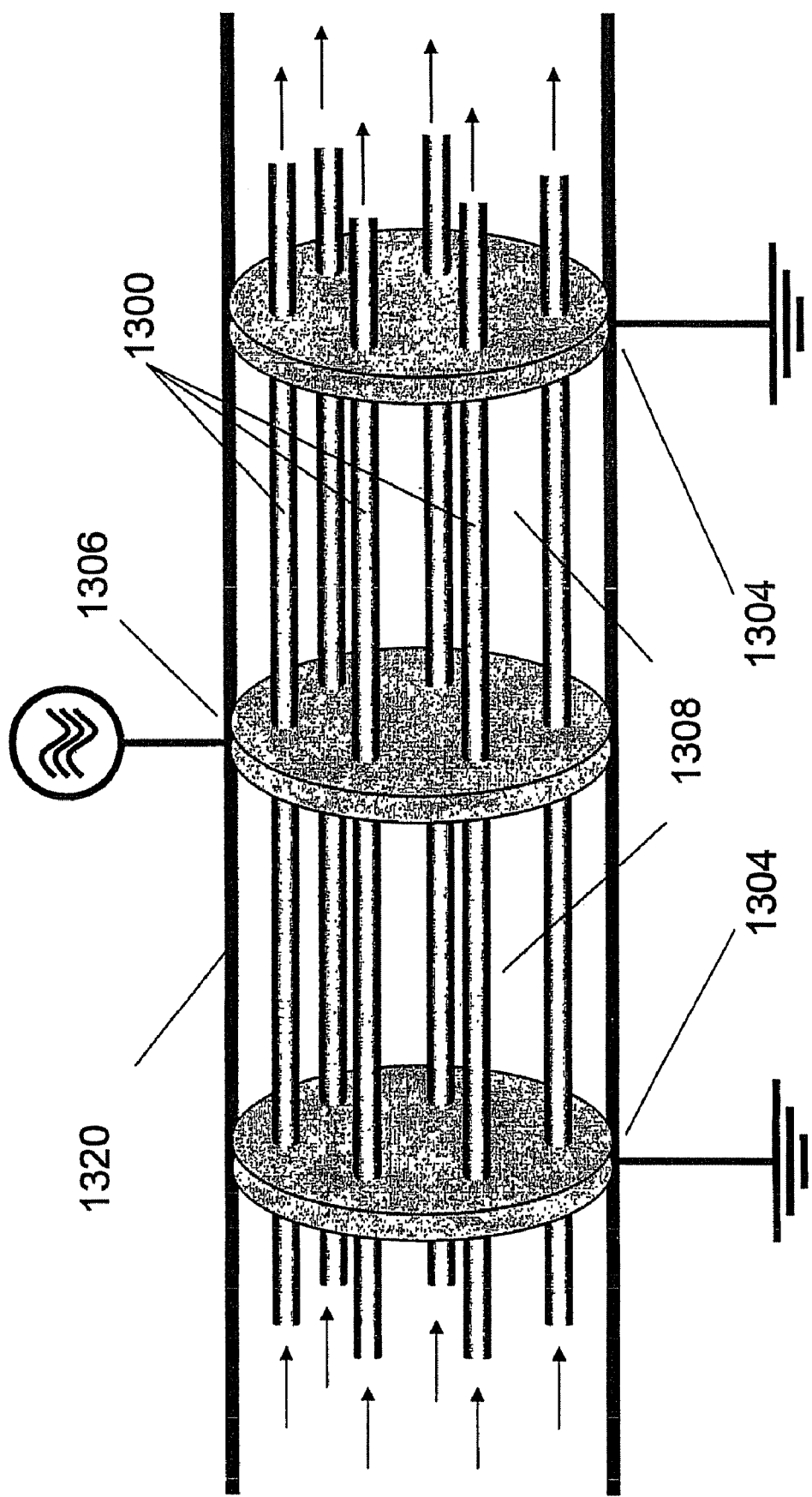
FIG. 13 is a schematic diagram of a parallel plasma reactor.

An alternative plasma reactor assembly is shown in FIG. 13. This assembly utilizes a plurality of RF reactors operating in parallel to increase nanoparticle production. As shown in the figure, this parallel plasma reactor includes multiple plasma chambers 1300 arranged with their plasma discharge axes in a substantially parallel alignment; The plasma chambers are housed within a single vacuum vessel 1302. As shown, the plasma chambers may take the form of discharge tubes (e.g., quartz discharge tubes) having narrow inside diameters while the vacuum vessel may take the from of a larger insulating tube. The arrangement of the plasma chambers may vary within the vacuum vessel. For example, in one exemplary embodiment the plasma chambers are arranged in a circular geometry around the central longitudinal axis of the vacuum vessel. The plasma chambers may have a common electrode assembly. In FIG. 13, the electrode assembly includes two outside, grounded electrodes 1304 and a central RF electrode 1306 through which each of the plasma chambers 1300 passes. The RF power cable associated with a RF generator may be attached to the central electrode, for example, at the center of the disc. A seal is formed between the outer electrodes and the vacuum vessel and the space between the RF electrode and each of the outer electrodes is filled with an appropriate dielectric medium 1308, such as polycarbonate, quartz or alumina. The dielectric medium prevents plasma formation outside of the plasma chambers and may also be used to hold the plasma chambers in place within the larger vacuum vessel. During operation, a plasma precursor gas and any buffer gases flow into the vacuum vessel and into the discharge tubes. A RF voltage is then applied across the electrodes and a radiofrequency discharge is ignited and sustained in each of the tubes to produce single-crystal nanoparticles. These nanoparticles then flow out the opposite ends of the discharge tubes as a nanoparticle aerosol.

In one illustrative embodiment the vacuum vessel is a quartz tube having a inside diameter of about 2 inches and each of the plasma chambers is quartz tube having an inside diameter of about 0.25 inches and an outside diameter of about 3/8 inches. The dielectric is composed of polycarbonate and the two electrodes are copper discs having a diameter of approximately 2 inches which fit tightly into the vacuum vessel tube. The electrodes each define 8 holes with diameters of approximately 3/8 inches through which the 8 plasma chamber tubes pass. It should be understood, however, that this embodiment is provided by way of illustration only and the materials and dimensions for use in the reactor may vary from what is described here.

Figure 14:
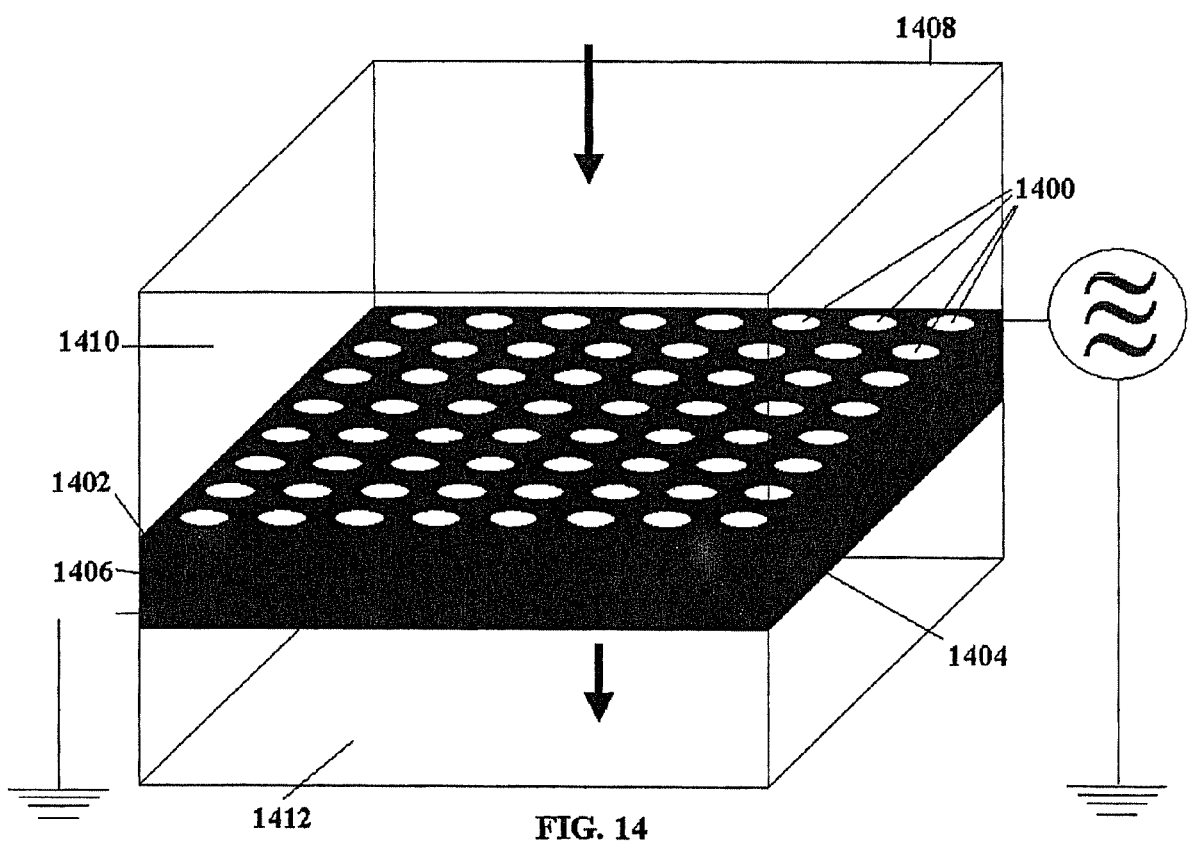
FIG. 14 is a schematic diagram of a parallel plasma reactor made from a composite sheet composed of a dielectric material sandwiched between an RF electrode and a ground electrode.

Yet another plasma reactor structure is shown in FIG. 14. This structure includes a matrix of holes 1400 perforating a composite sheet made from two electrodes 1402, 1404 separated by a dielectric material 1406. The first of the two electrodes is an RF electrode 1402 and the second of the two electrodes 1404 is grounded. The dimensions of the perforations and the composite sheet are selected such that when an RF voltage is applied across the electrodes in the presence of a plasma precursor gas, a RF plasma is ignited in the holes. In this construction, the matrix of holes provides a matrix of substantially parallel plasma reaction chambers. In a typical embodiment the electrodes are about 0.1 to 2 mm thick, the dielectric layer is about 5 to 50 mm thick and the holes have an inner diameter of about 2 to 20 mm. The center-to-center distance between the holes is typically about 4 to 40 mm. However, the present invention is not limited to structures having these dimensions. In the embodiment depicted in FIG. 14, the composite sheet is housed within a vacuum chamber 1408 and separates an input chamber 1410 from which a plasma precursor gas and any buffer gases flow into the holes and an output chamber 1412 into which an aerosol of nanoparticles is injected from each of the plasma chambers (i.e., holes). Examples of suitable materials for the electrodes are metals, such as copper and, in particular, thin metal foils. Examples of suitable dielectric materials include, but are not limited to, ceramics. The operating parameters (e.g., absolute pressure, partial pressures of the reactants and flow rates) for this apparatus may be the same as those discussed elsewhere in this disclosure. However, methods for producing nanoparticles using this apparatus are not limited to those having operating parameters that fall within these ranges.

EXAMPLES

Exemplary embodiments of the processes for producing crystalline semiconductor nanoparticles are provided in the following examples. The examples are presented to illustrate the present processes and to assist one of ordinary skill in using the same. The examples are not intended in any way to otherwise limit the scope of the invention.

Example 1

Production of Single-Crystal Silicon Nanoparticles Having a Particle Size of Approximately Ten Nanometers or Less Using the experimental apparatus depicted in FIGS. 1 and 2, single-crystal silicon nanoparticles were generated. The electrodes in the electrode assembly were copper ring electrodes composed of a copper wire wound about the outside of a quartz tube plasma chamber having an inside diameter of 1/4 inch. A mixture of silane in helium ($SiH_4$:He 5%:95%) was used as a precursor gas and argon was used as a buffer gas. The plasma generation conditions used in this example included a chamber pressure in the presence of the plasma of 13 Torr, an argon flow rate of 200 sccm, a $SiH_4$:He flow rate of 0.31 sccm, and an RF power of 120 Watts. When the constricted RF plasma was created nanoparticles were formed through the dissociation of silane into silicon and hydrogen, followed by nucleation of silicon particles in the constricted plasma. The plasma was run for approximately 60 seconds, during which a narrow striated current channel (i.e., filament) having high density plasma nodes could be observed inside the quartz tube. The current channel rotated in an annular region close to the quartz tube walls at a frequency of about 800 Hz. It is estimated that the nanoparticle resonance time in the annular plasma regions was on the order of about 4 milliseconds, during which time the nanoparticles were exposed to the current channel numerous times. In order to collect the nanoparticles for analysis, a TEM grid was placed in front of the evacuator/dilutor.

Figure 3:
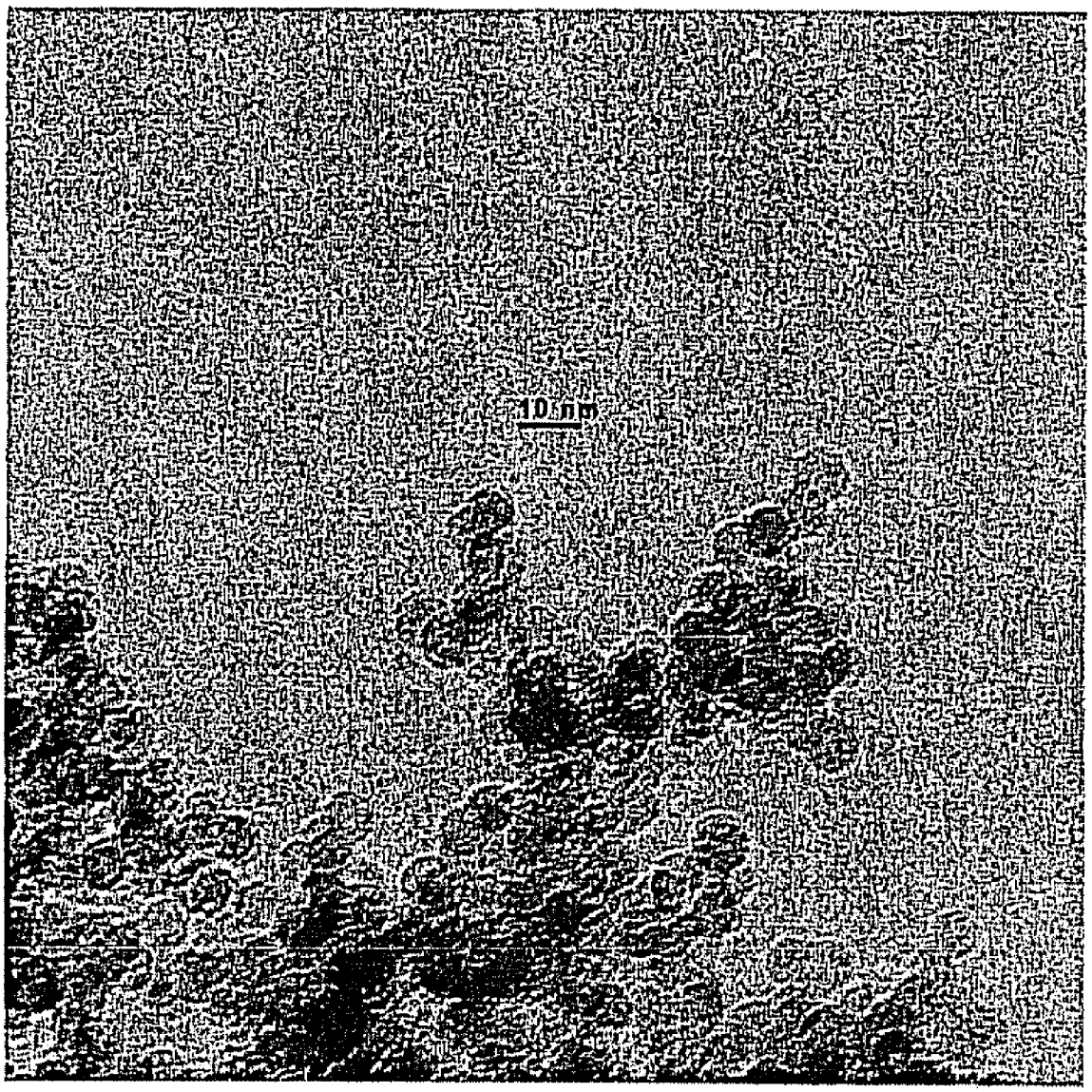
FIG. 3 shows a transmission electron microscope (TEM) image of single-crystal silicon nanoparticles produced according to Example 1.
Figure 4:
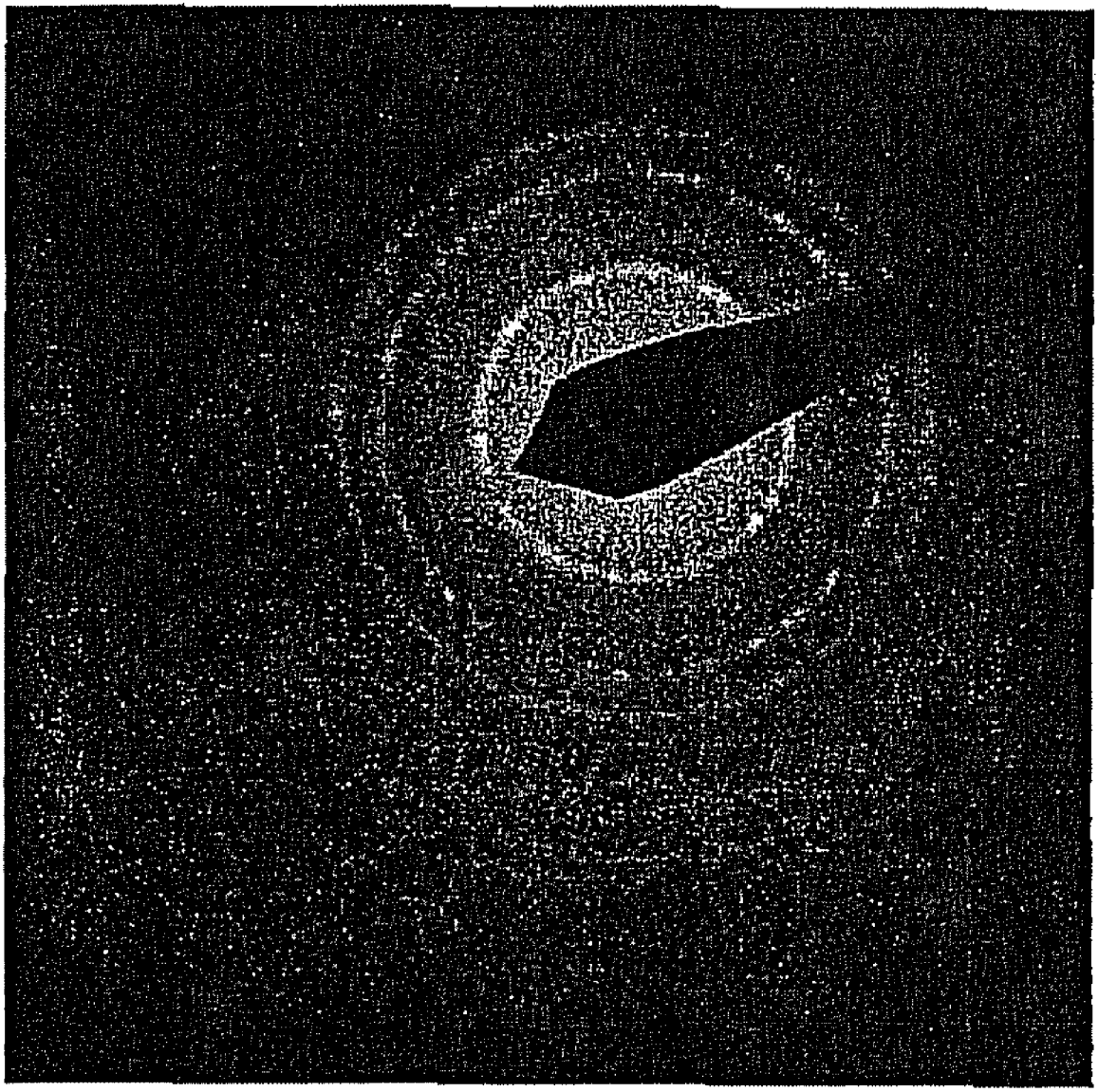
FIG. 4 shows the diffraction pattern for the nanoparticles of FIG. 3.
Figure 5:
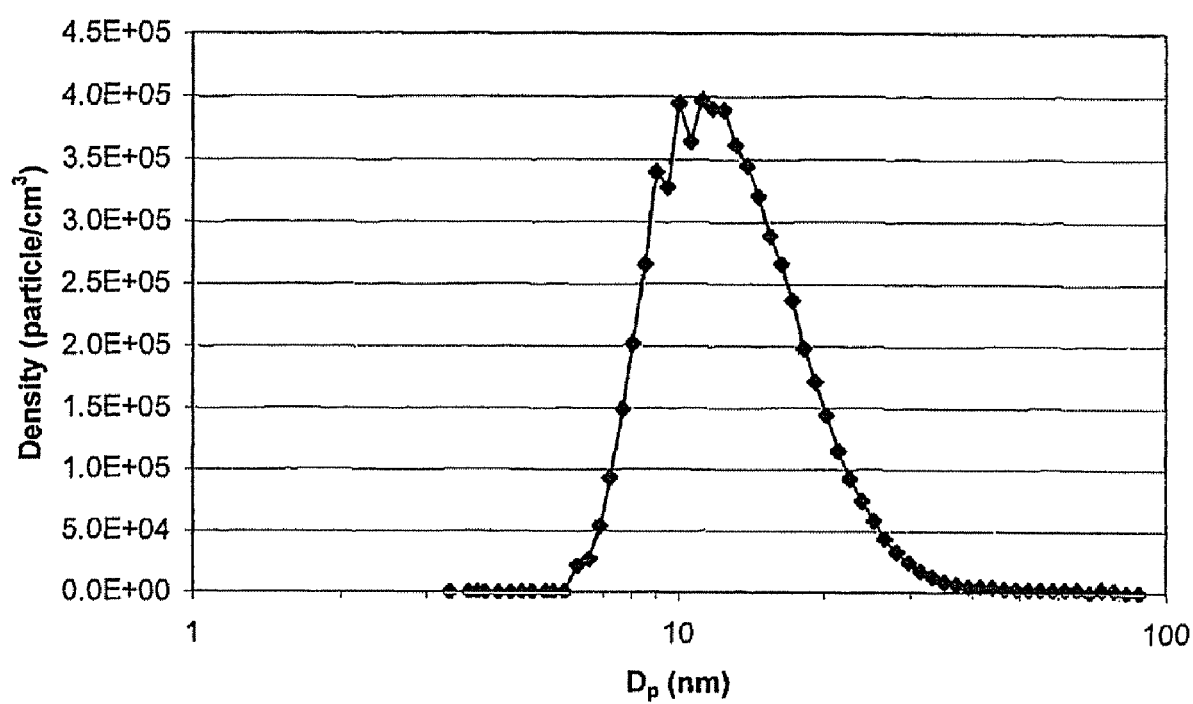
FIG. 5 shows a graph of the size distribution of the single-crystal silicon nanoparticles produced according to Example 1.

A TEM analysis of the nanoparticles was performed on a high resolution JEOL 1201 transmission electron microscope operating at an accelerating voltage of 120 kV. The TEM image of the silicon nanoparticles is shown in FIG. 3. The nanoparticles are crystalline nanoparticles, as evidenced by the diffraction pattern shown in FIG. 4. The primary particle diameter for the silicon nanoparticles is approximately 10 nm. The size distribution for the nanoparticles measured with a DMA is shown in FIG. 5. The distribution is relatively monodisperse, centered at approximately 13.6 nm mean particle diameter with a standard deviation of about 5.8 nm.

The image of FIG. 3 indicates that there may be some agglomeration of the silicon nanoparticles deposited on the TEM grid. This agglomeration may occur as the nanoparticles are deposited on the TEM grid.

Example 2

Production of Single-Crystal Silicon Nanoparticles Having a Particle Size of Approximately Five Nanometers or Less The experiment of Example 1 was repeated using the following modified plasma generation conditions: the chamber pressure in the presence of the plasma was 11 Torr, the flow rate of $SiH_4$:He was increased to 0.34 sccm and the RF power applied to the RF powered electrode was decreased to 110 Watts. The plasma was run for approximately 60 seconds, during which a narrow striated current channel (i.e., filament) having high density plasma nodes could be observed inside the quartz tube. The current channel rotated in an annular region close to the quartz tube walls at a frequency of about 800 Hz. It is estimated that the nanoparticle residence time in the annular plasma regions was on the order of 4 milliseconds, during which time the nanoparticles were exposed to the current channel numerous times. In order to collect the nanoparticles for analysis, a TEM grid was placed in front of the evacuator/dilutor.

Figure 6:
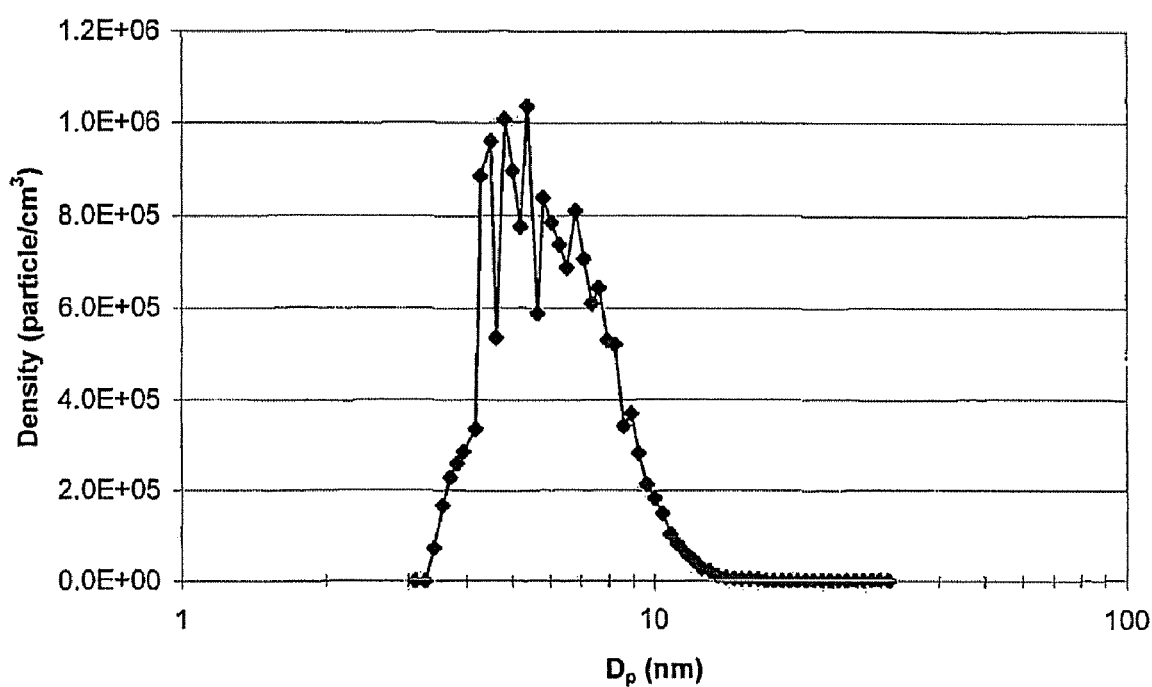
FIG. 6 shows a graph of the size distribution of the silicon nanoparticles produced according to Example 2.
Figure 7:
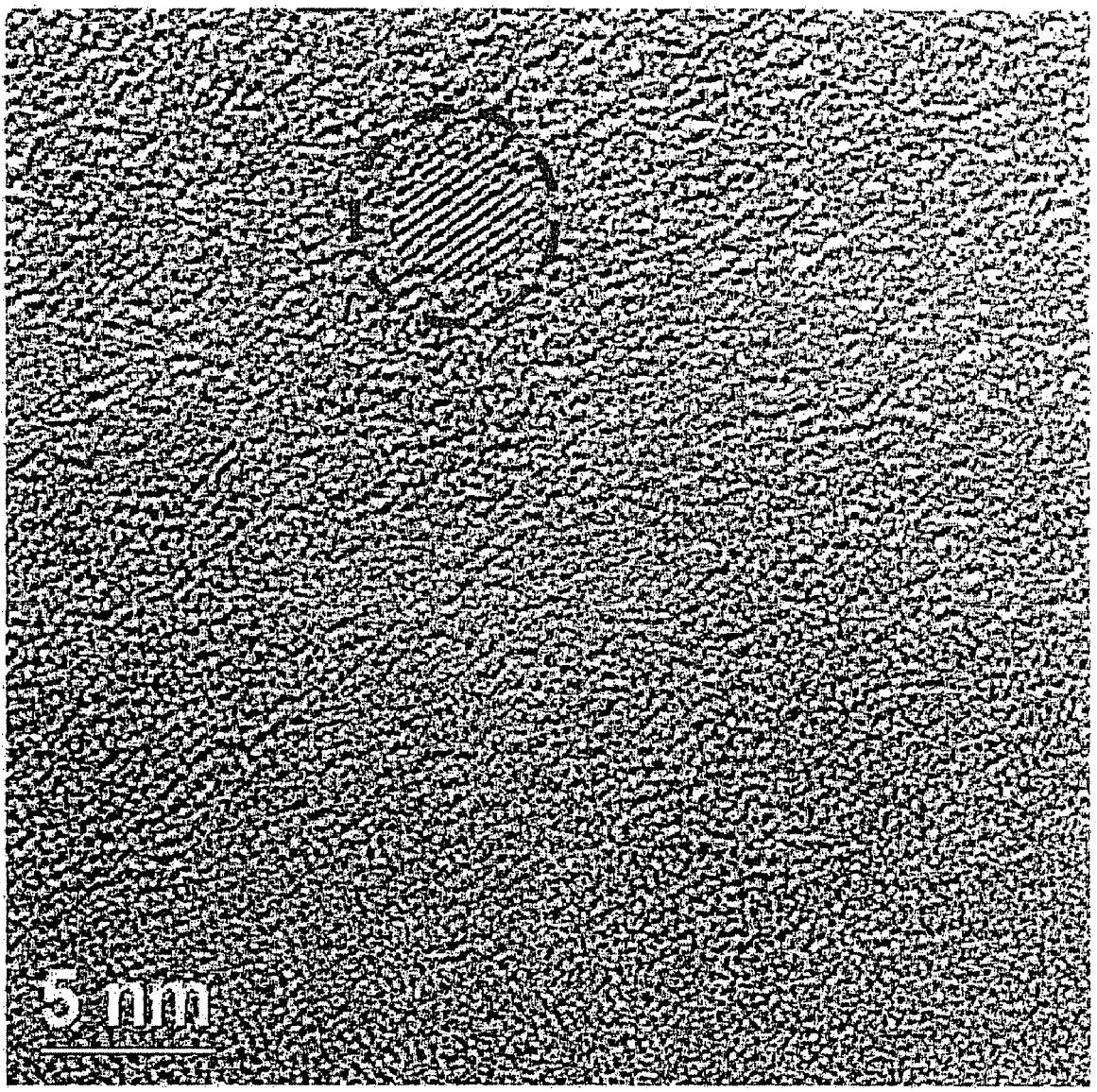
FIG. 7 shows a TEM image of a single-crystal silicon nanoparticle produced according to Example 2.

FIG. 6 shows the particle size distribution for the crystalline silicon nanoparticles obtained in this example. The distribution is relatively monodisperse, centered at approximately 6.2 nm mean particle diameter with a geometric standard deviation of about 1.8 nm. The size distribution shown in FIG. 6 reflects nanoparticles having a primary particle size of about 3-5 nm which have undergone some moderate agglomeration after leaving the plasma. FIG. 7 shows the TEM image of a single-crystal silicon nanoparticle produced in accordance with this example. The TEM images were obtained with a high resolution JEOL 2010F transmission electron microscope operating at an accelerating voltage of 200 kV. The silicon nanoparticle shown in FIG. 7 has a particle diameter of less than about 5 nm.

Example 3

Production of Single-Crystal Silicon Nanoparticles Having a Particle Size of Approximately 30 to 50 Nanometers Single-crystal silicon nanoparticles were formed using the apparatus shown in FIGS. 1 and 2 with the modification that a copper plate electrode was used as the ground electrode rather than a copper ring electrode and a quartz tube having a 1.85 inch inside diameter, rather than a ¼ inch inside diameter was used. The two electrodes were separated by a distance of approximately 10-15 cm. A mixture of silane in helium ($SiH_4$:He=5%:95%) was used as a precursor gas and argon was used as a buffer gas. The plasma generation conditions used during the formation of the silicon nanoparticles included a chamber pressure of approximately 1.5 Torr, an argon flow rate of 3 sccm, a $SiH_4$:He flow rate of 2.5 sccm and an RF power input of 200 Watts. The plasma was run for approximately 90 seconds, during which a narrow striated current channel (i.e., filament) having about 15 high density plasma nodes could be observed inside the quartz tube. The current channel rotated in an annular region close to the quartz tube walls at a frequency of about 150 Hz. It is estimated that the nanoparticle resonance time in the annular plasma regions was on the order of four seconds, during which time the nanoparticles were exposed to the current channel numerous times. An aerosol containing single-crystal silicon nanoparticles formed in the quartz tube was extracted by passing the aerosol through a 1 mm extraction orifice. The pressure in a low pressure chamber downstream of the extraction orifice was $10^{-3}$ Torr. This pressure difference led to the formation of a supersonic gas jet downstream of the orifice. Particles exiting the quartz tube were accelerated in this jet to velocities of up to 250 m/s and are deposited onto a substrate by inertial impaction.

Figure 8:
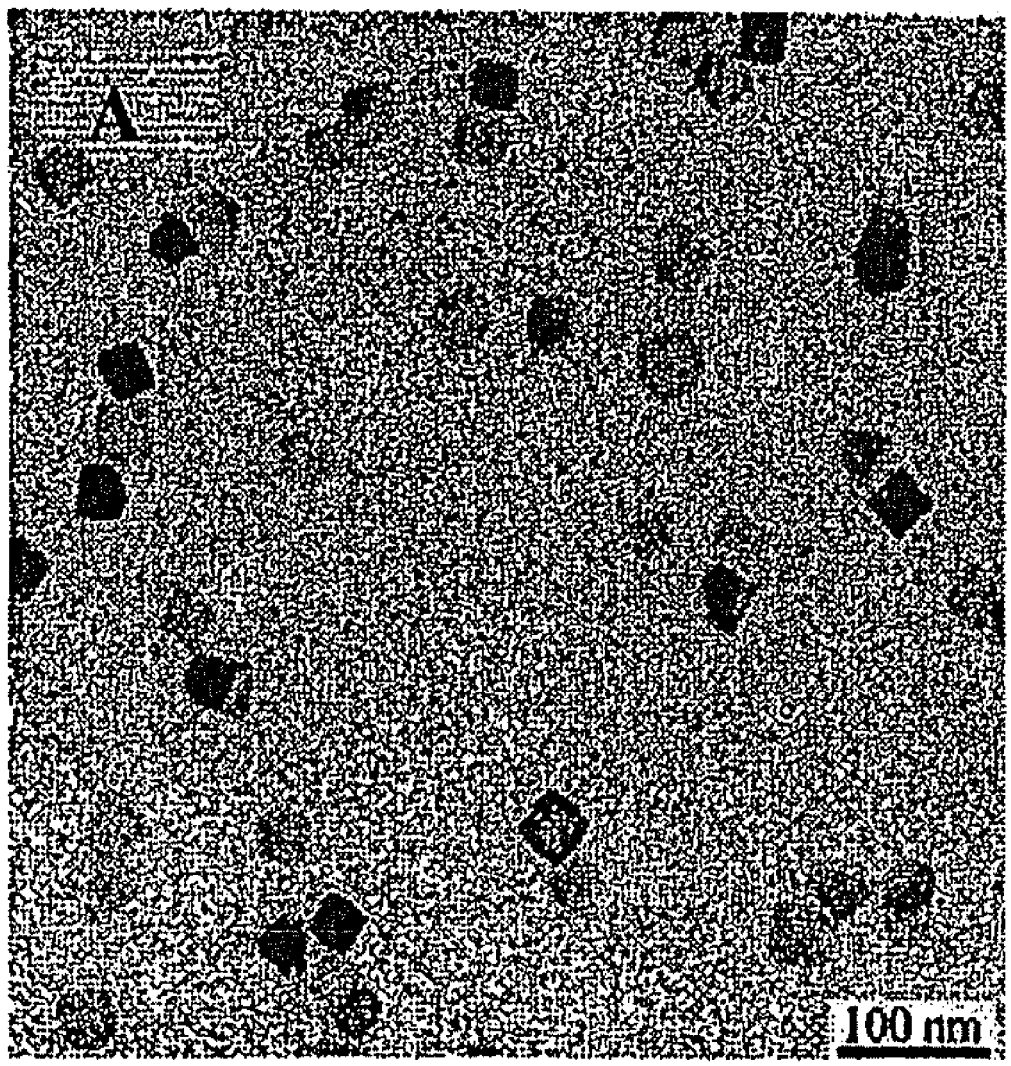
FIG. 8 shows a TEM image of the single-crystal silicon nanoparticles produced according to Example 3.
Figure 9:
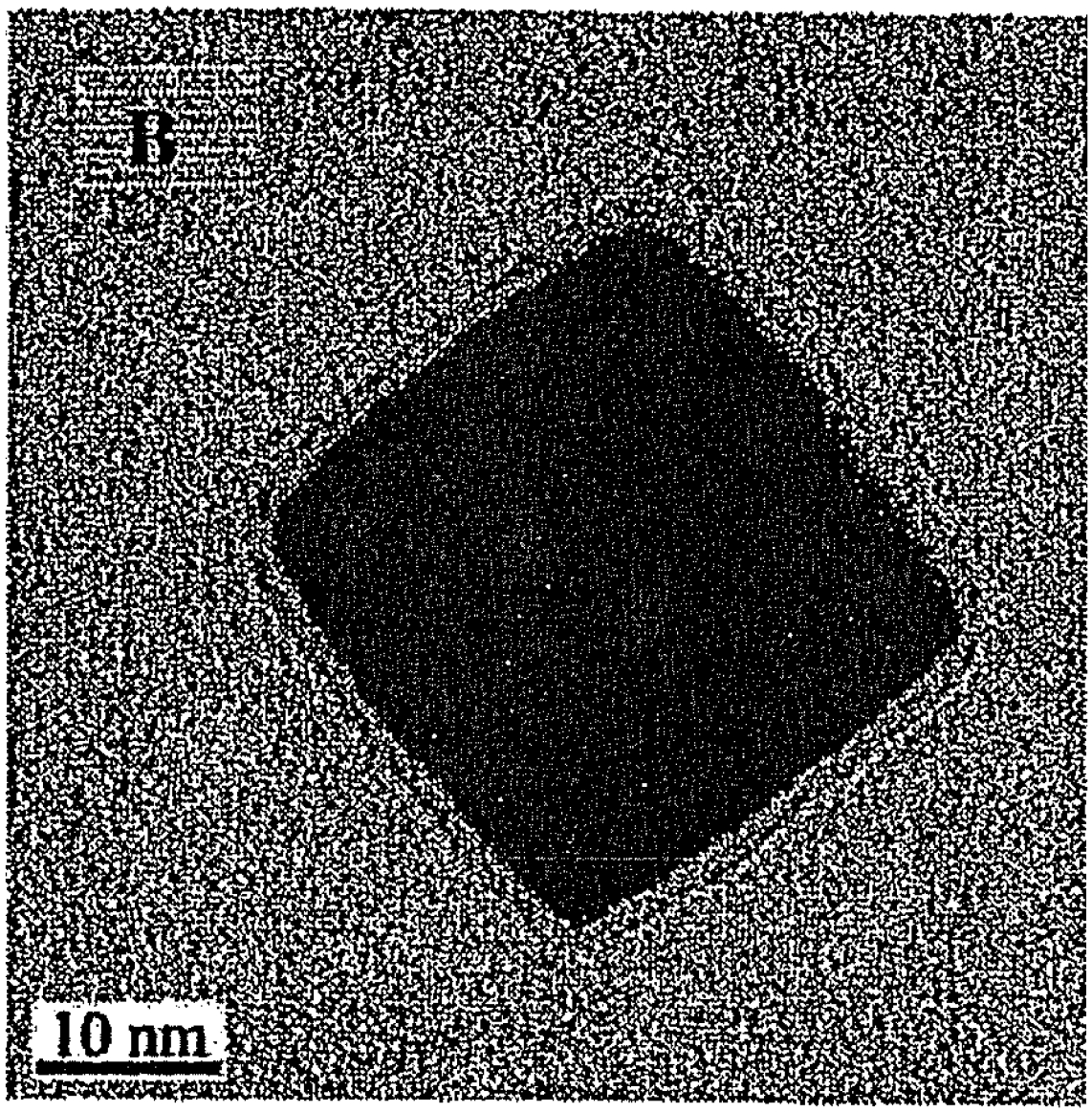
FIG. 9 shows a TEM image of an individual single-crystal silicon nanoparticle produced according to Example 3.

TEM analysis of the nanoparticles was performed on a Philips CM30 transmission electron microscope operating at an accelerating voltage of 300 kV. FIG. 8 shows a TEM image of some of the silicon nanoparticles. Most of the deposited nanoparticles were cubes with the faces along the [100] planes. The difference in the apparent contrast of the particles is due to small differences in the alignment of the particles with respect to the electron beam. Aligned particles show strong Bragg diffraction and appear dark. The silicon nanoparticles were single-crystal diamond-cubic silicon as verified by selected-area electron diffraction (not shown). FIG. 9 shows a high resolution TEM image of an individual silicon nanoparticle (circled). No evidence of dislocations or other planar defects in the crystalline nanoparticle was found. A 1-2 nm thin amorphous layer surrounds the particle. This layer is most likely an oxide surface layer formed on exposure of the nanoparticles to air.

Figure 10:
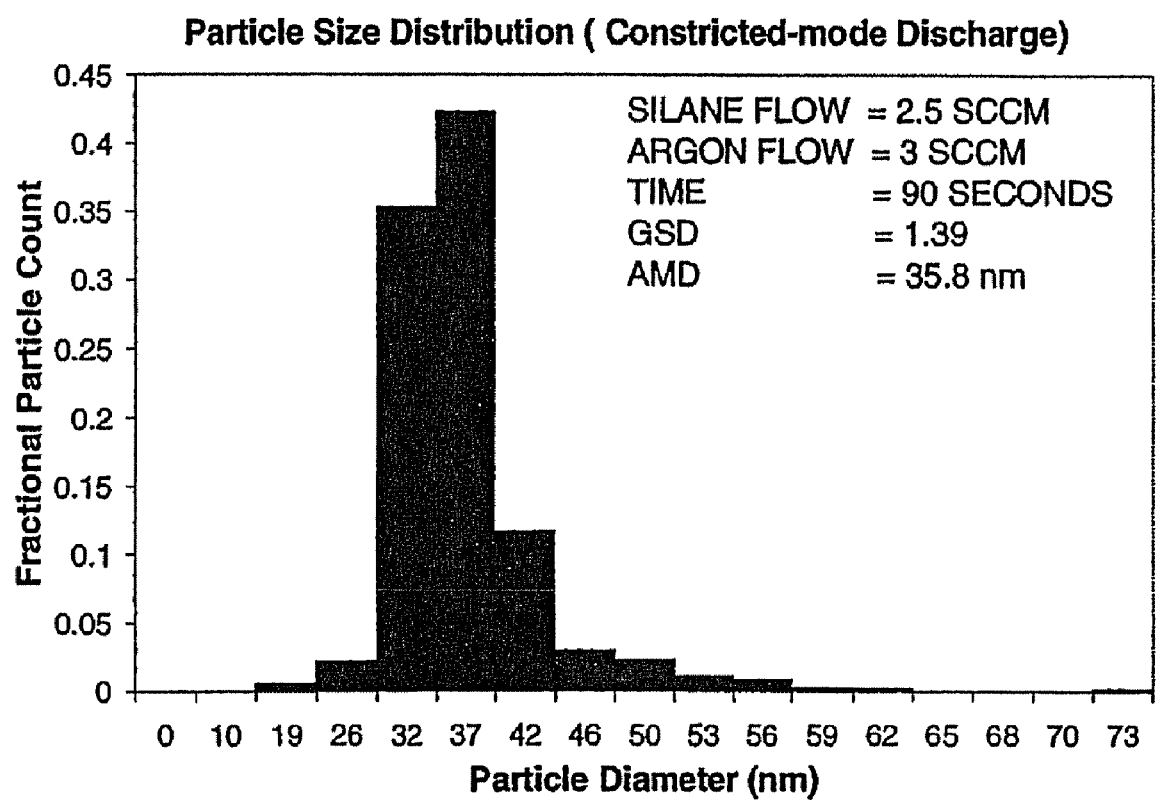
FIG. 10 shows a graph of the size distribution of the silicon nanoparticles produced according to Example 3.

FIG. 10 shows the particle size distribution as determined from image analysis of the TEM images. Using the software NIH Image J, the particle diameter is obtained from the TEM images by assuming the particle area to be the projection of a spherical particle. The particle size distribution shown in FIG. 10 is based on the analysis of more than 700 particles. The distribution is rather monodisperse, centered at 35 nm mean particle diameter with a geometric standard deviation of 1.3. The crystallinity of the particles implies a high gas temperature.

Example 4

Production of Photoluminescent Single-Crystal Silicon Nanoparticles

In this example photoluminescence was observed for single-crystal silicon nanoparticles obtained with the apparatus of FIGS. 1 and 2. The nanoparticles were deposited on a quartz tube serving as substrate through thermophoretic deposition, which relies on the so called thermophoretic force which in the presence of a temperature gradient in the gas pushes particles from hot to cold regions. Liquid nitrogen was flowed through the quartz tube in order to cool it to well below room temperature. The gas emanating from the plasma reactor was at temperatures higher than room temperature leading to deposition of the particles on the tube. After deposition the nanoparticles were removed from the chamber and exposed to the atmosphere. Upon exposure to the atmosphere, the particles exhibited photoluminescence.

To collect the photoluminescence spectrum, the nanoparticles were placed in front of the entrance slit to a monochromator (ISA Instruments model HR-320). The nanoparticles were then illuminated using UV light from a lamp emitting at 365 nm (UVP model: UVL-56). The UV light from the lamp passed through a low pass filter (Nikon model UR-2). The silicon nanoparticles emitted light via photoluminescence (PL) under UV illumination. The PL light passed into the entrance slit of the monochromator. The monochromator only allowed light of a given wavelength to pass through it. At the exit of the monochromator, the light was detected by a photomultiplier (Hamamatsu model: C659-71). The electrical signal generated by the photomultiplier was recorded by a photon counter (Hamamatsu model: C5410) which converted the electrical signal from the photomultiplier into photon counts. The photon counter then sent the photon counts to a computer via RS232 communication for storage. The monochromator was scanned through portions of the visible spectrum using a computer control unit (Spectra-Link, ISA Instruments).

The nanoparticles produced in accordance with the methods described in the patent were found to exhibit photoluminescence. The photoluminescence usually became more intense the longer the particles were exposed to the atmosphere. Particles produced at the conditions outlined in Example 1 and Example 2 above exhibit photoluminescence. Particles, which were produced at conditions under which a "rotating constriction" was present, usually exhibited much more intense photoluminescence than samples produced when the constriction was present but not rotating. This may be because a smaller fraction of the flow passes through the constriction, which may cause a smaller portion of the particles to be crystalline. It has been observed that particles produced at different experimental conditions exhibit photoluminescence at different wavelengths. Visible photoluminescence has been observed in a range from ~450 nm to more than 775 nm.

Silicon nanoparticles made in accordance with this Example were deposited on quartz tubes. The nanoparticles were observed to photoluminesce when excited by a UV lamp (at 360 nm) sitting below the tubes.

Example 5

Production of Single-Crystal Silicon Nanoparticles in a Non-Constricted RF Plasma Using the same experimental apparatus described in Example 1, photoluminescent single-crystal silicon nanoparticles were generated in a non-constricted radiofrequency plasma. The use of a non-constricted RF plasma allows for the production of silicon nanoparticles at considerably lower pressures. A mixture of silane in helium ($SiH_4$:He=5%:95%) was used as a precursor gas and argon was used as a buffer gas. The plasma generation conditions used in this example included a chamber pressure in the presence of the plasma of about 1.5 Torr, an argon flow rate of about 30-50 sccm, and a $SiH_4$:He flow rate of 10 sccm. When the RF plasma was created nanoparticles were formed through the dissociation of silane into silicon and hydrogen, followed by nucleation of silicon particles. In order to collect the nanoparticles for analysis, a TEM grid was placed in front of the evacuator/dilutor.

Figure 15:
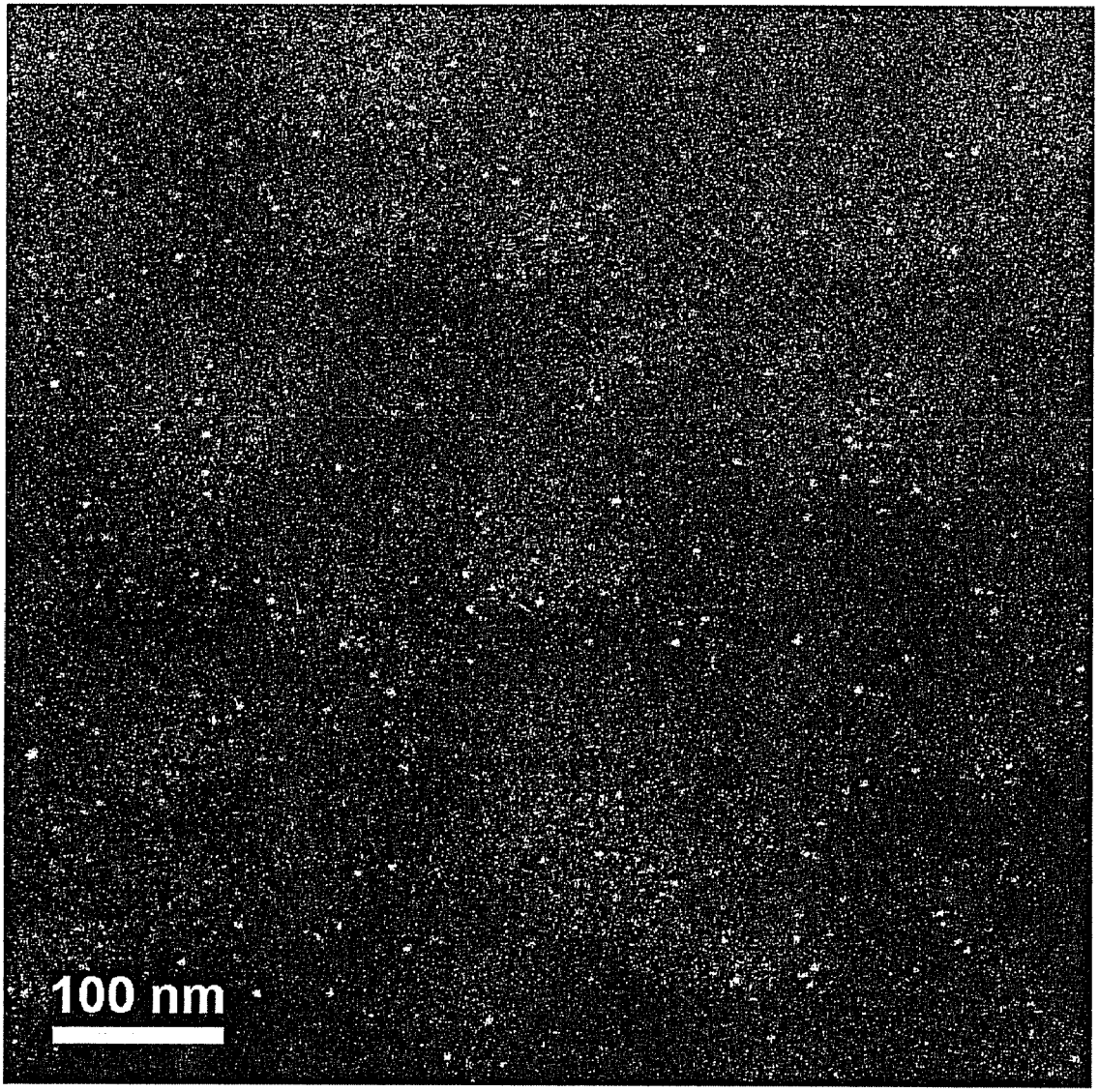
FIG. 15 shows a dark-field transmission electron micrograph of photoluminescent silicon nanoparticles made in accordance with Example 4.
Figure 16:
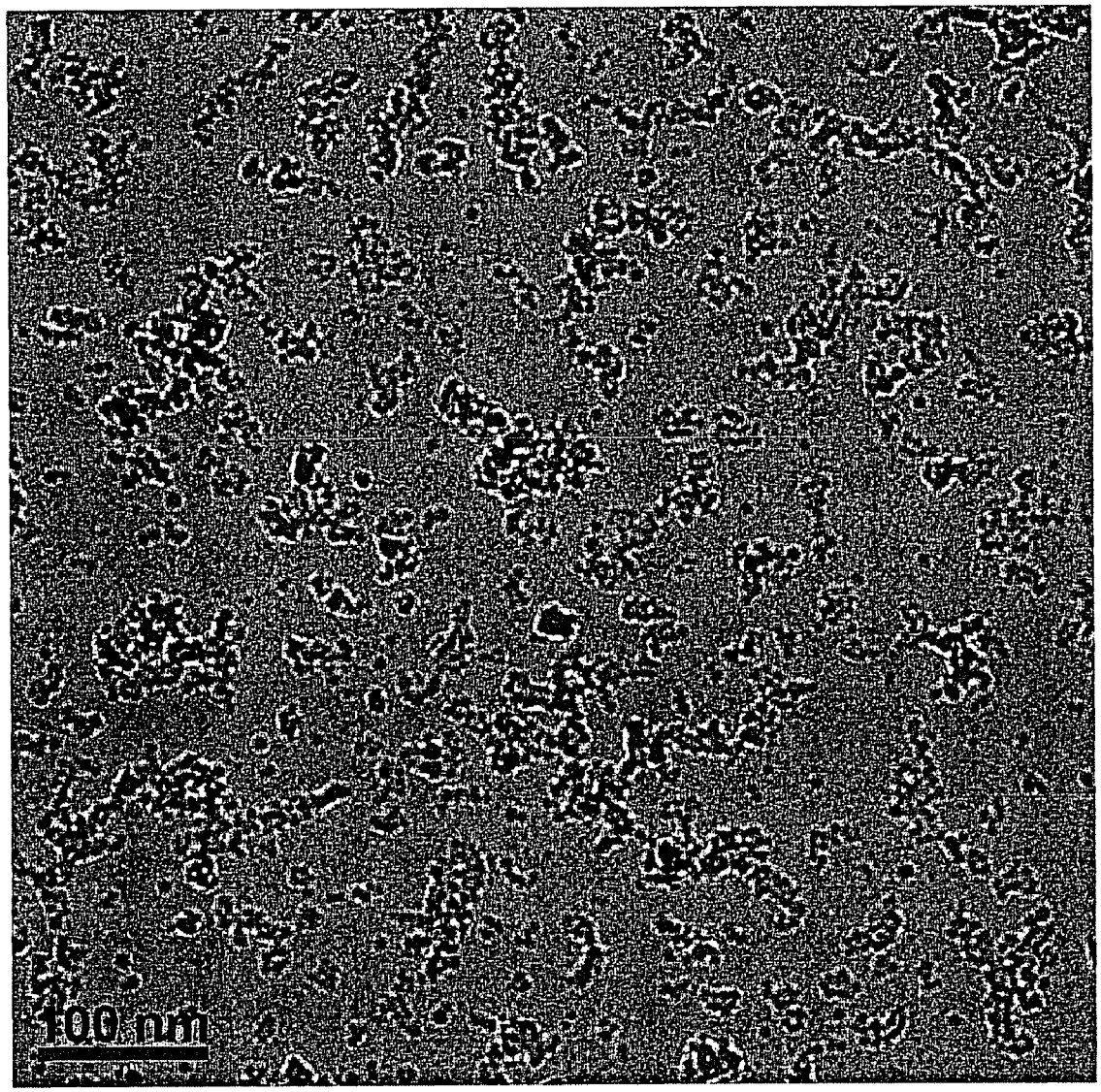
FIG. 16 shows a dark-field transmission electron micrograph of photoluminescent silicon nanoparticles made in accordance with Example 4.

A TEM analysis of the nanoparticles was performed on a high resolution JEOL 1201 transmission electron microscope operating at an accelerating voltage of 120 kV. Two TEM images of the silicon nanoparticles are shown in FIGS. 15 and 16. The figures are dark field images wherein silicon single crystals are illuminated as bright points against the dark background of the micrograph.

The image of FIG. 16 indicates that there may be some agglomeration of the silicon nanoparticles deposited on the TEM grid. This agglomeration may occur as the nanoparticles are deposited on the TEM grid.

Figure 17:
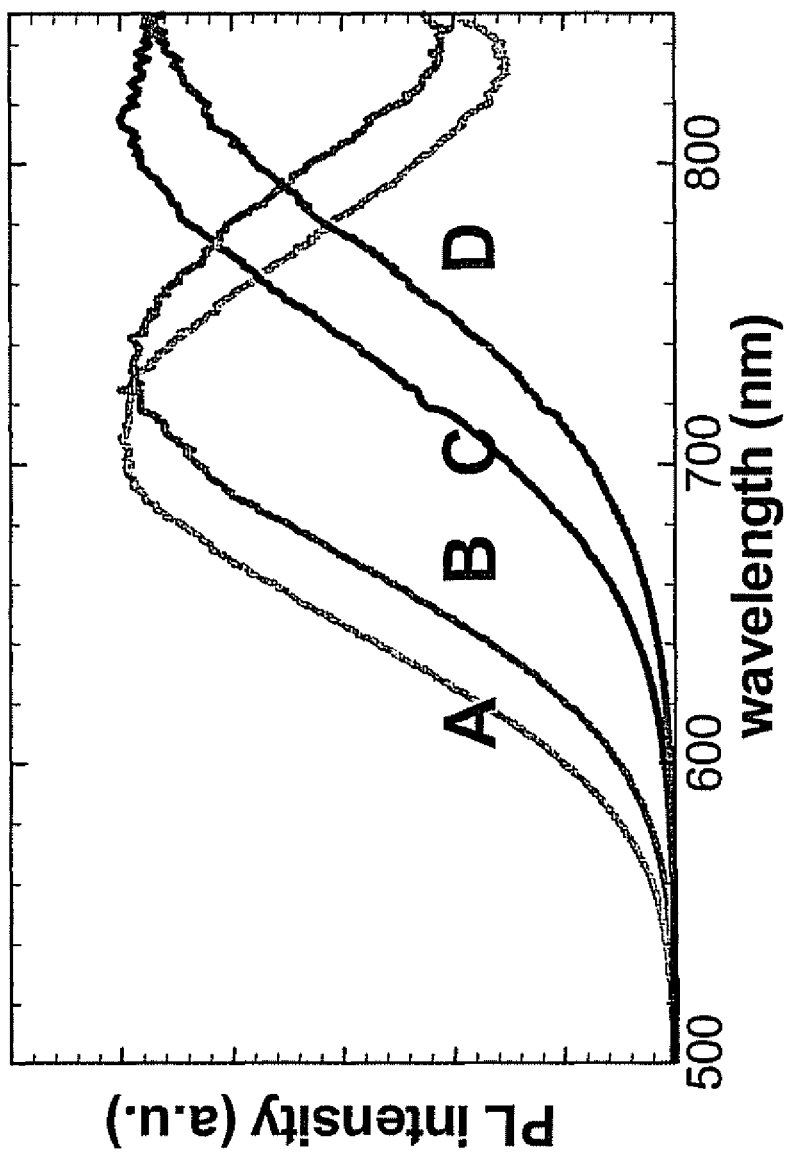
FIG. 17 shows the photoluminescence spectra for crystalline Si nanoparticles synthesized in accordance with Example 4, below.

Silicon nanoparticles made in accordance with this example were dispersed in methanol and showed to be photoluminescent. The photoluminescence spectra for these nanoparticles are shown in FIG. 17.

Example 6

Production of Core-Shell Single-Crystal Silicon Nanoparticles

Figure 18:
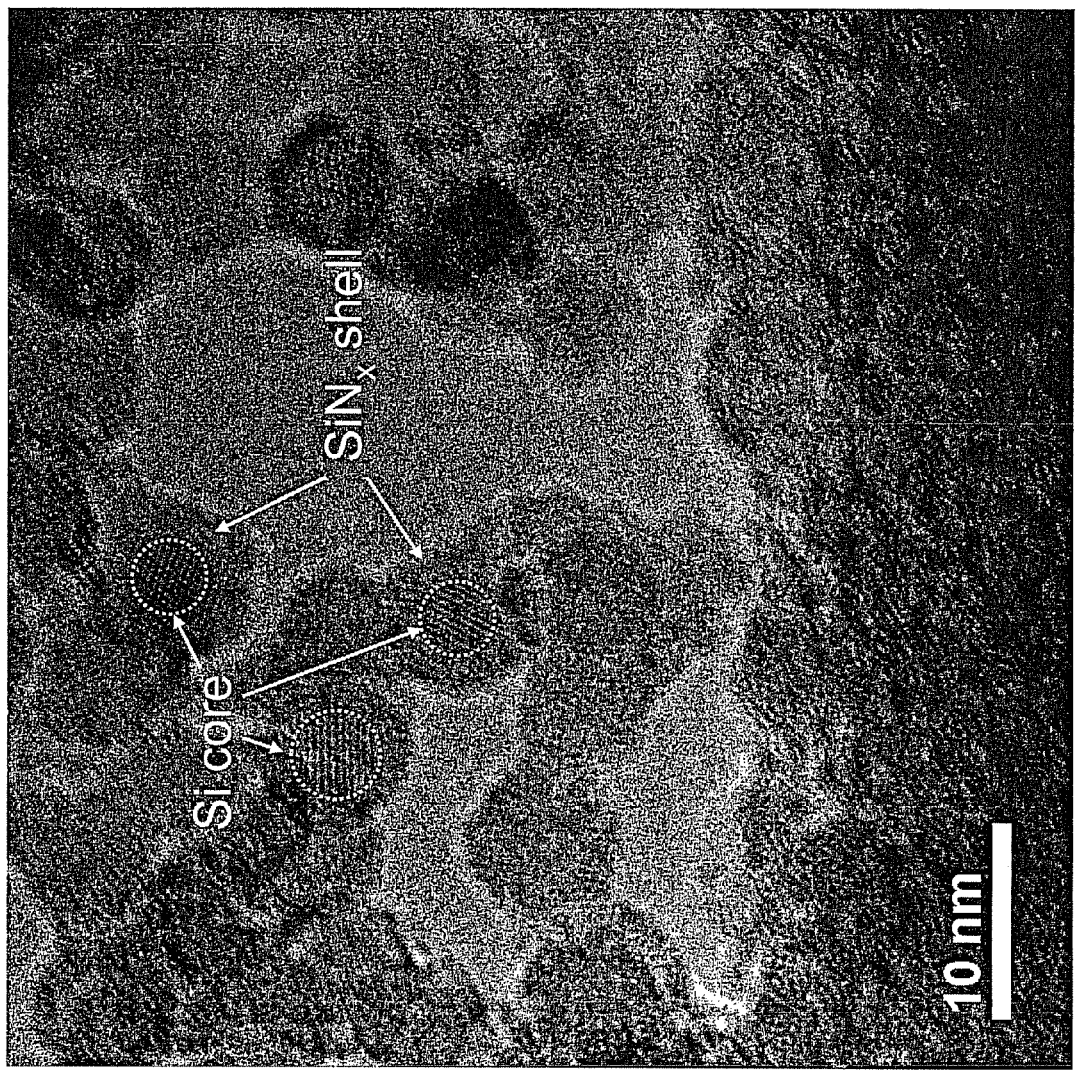
FIG. 18 shows a dark-field transmission electron micrograph of photoluminescent silicon nanoparticles made in accordance with Example 6, below.

This example describes the synthesis of core-shell silicon nanoparticles using a two-stage plasma reactor. Crystalline Si nanoparticles were produced in the first stage using 40 W of RF power, 145 sccm of Ar, and 5 sccm of $SiH_4$ (10% in Ar). Conditions for the second plasma stage were: 5 sccm of $SiH_4$ (10% in Ar), 5 sccm $NH_3$, using 40 W of RF power. The pressure in both stages was about 6 Torr. An approximately 3 nm thick shell layer of $SiN_x$ was deposited on the nanoparticles. A micrograph of the nanoparticles is shown in FIG. 18. Luminescence was not observed from the particles, since these particles were deliberately formed too big in order to make TEM analysis easier.

Figure 19:
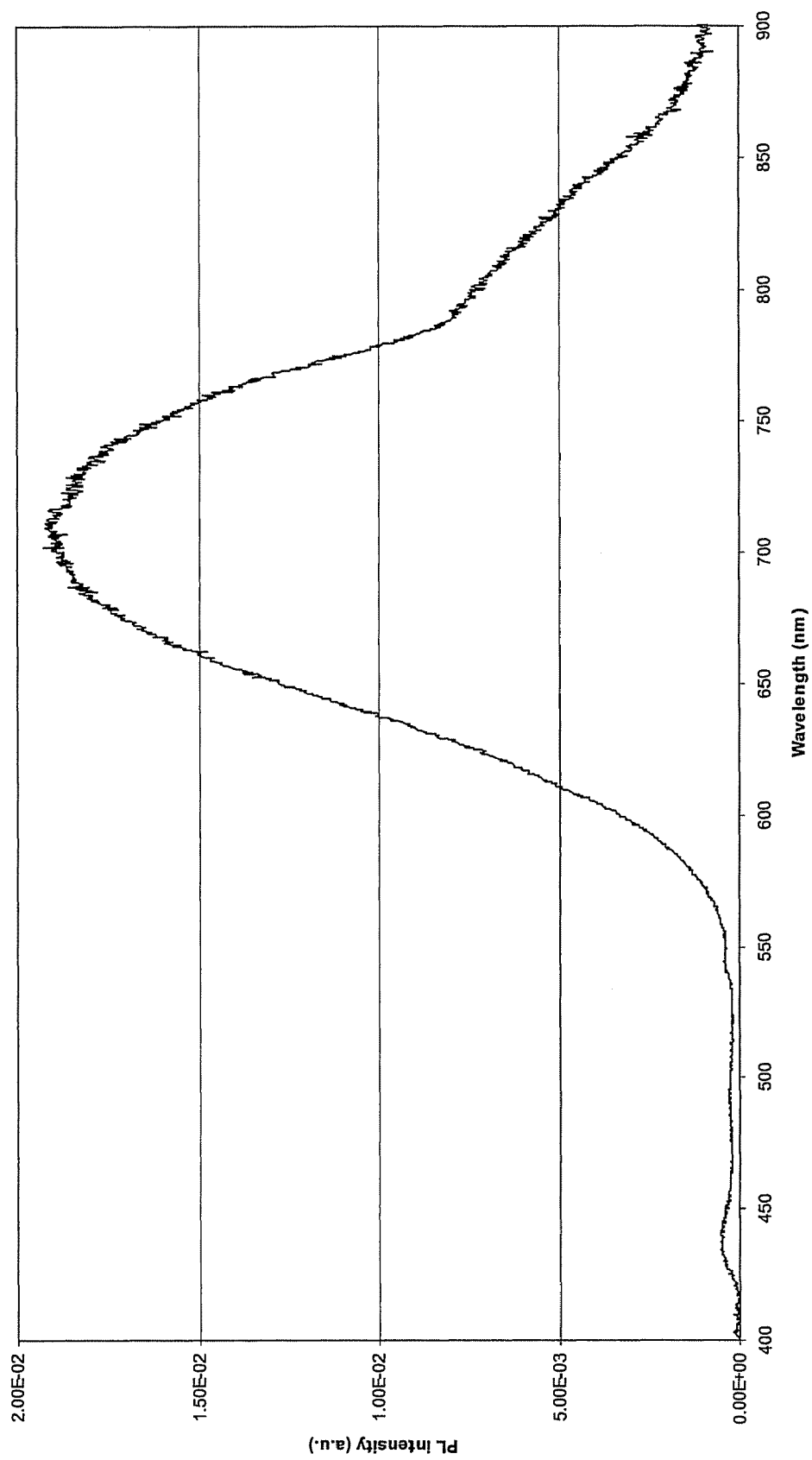
FIG. 19 shows the photoluminescence spectra for crystalline Si nanoparticles synthesized in accordance with Example 6, below.

Relatively strong luminescence could be observed, however, by using the following method of nanoparticle passivation: particles produced in the first stage were collected on a mesh that was placed at the end of the second stage. During particle deposition for 20 min., (1st stage conditions=20 W of RF power, 50 sccm of Ar, and 10 sccm of $SiH_4$ (5% in He)) the second stage was turned off. The pressure was about 1.4 Torr. After deposition, the second stage was turned on and a pure $NH_3$ plasma was run at 100 W, 100 sccm $NH_3$ for 30 min. Again, the pressure was about 1.4 Torr. Under these conditions, the 2nd stage $NH_3$ plasma was in direct contact with the particles collected on the collection mesh. A $SiN_x$ (silicon nitride) layer was formed by direct nitridation of the silicon particles. The photoluminescence spectrum for the crystalline Si nanoparticles is shown in FIG. 19.

As a screening test for both cases, nanoparticles were exposed to KOH and were stable in the base environment. In contrast, Si and $SiO_2$ nanoparticles are etched very rapidly by the base solution.

For the purposes of this disclosure and unless otherwise specified, "a" or "an" means "one or more". All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

What is claimed is:

1. A plasma reactor for producing nanoparticles, comprising:
   a plasma reactor chamber having a length extending in a flow direction from an inlet to an outlet;
   a source of a continuous precursor monomer gas flow through the plasma reactor chamber along the length of the plasma reactor chamber from the inlet to the outlet which includes a semiconductor containing precursor monomer, the source coupled to the inlet of the plasma reactor chamber;
   at least two electrodes, the at least two electrodes arranged in the flow through the plasma reactor chamber perpendicular to the flow direction and spaced apart a distance along the length of the plasma reactor, and the at least two electrodes capacitively couple to the precursor monomer gas in the plasma rector chamber and wherein the gas flow is through the at least two electrodes; and
   a high frequency voltage source capacitively coupled to the at least two electrodes which applies a high voltage therebetween and responsively continuously dissociates the semiconductor containing precursor monomer in the plasma reactor chamber to provide precursor species that nucleate and grow into semiconductor nanoparticles, wherein;
   the precursor is primarily converted into nonagglomerated semiconductor nanoparticles and the nanoparticles are carried out of the reactor through the outlet in a continuous fashion.

2. The apparatus of claim 1, including a substrate arranged to receive the semiconductor nanoparticles.

3. The apparatus of claim 2, wherein the substrate is moved in a continuous or step-wise fashion to produce a film of crystalline nanoparticles on the substrate.

4. The apparatus of claim 1, wherein the high frequency source generates single-crystal semiconductor nanoparticles from the source of continuous precursor monomer.

5. The apparatus of claim 1, wherein the high frequency source generates single-crystal semiconductor nanoparticles having an average diameter of no more than about 50 nm from the source of continuous precursor monomer.

6. The apparatus of claim 1, wherein the high frequency source generates Group IV semiconductor nanoparticles from the source of continuous precursor monomer.

7. The apparatus of claim 1, wherein the high frequency source generates Group IV semiconductor nanoparticles comprising silicon nanoparticles from the source of continuous precursor monomer.

8. The apparatus of claim 1, wherein the high frequency source generates semiconductor nanoparticles comprising Group II-VI semiconductor nanoparticles from the source of continuous precursor monomer.

9. The apparatus of claim 1, wherein the high frequency source generates Group II-VI semiconductor nanoparticles comprising CdSe nanoparticles from the source of continuous precursor monomer.

10. The apparatus of claim 1, wherein the high frequency source generates semiconductor nanoparticles comprising Group III-V semiconductor nanoparticles from the source of continuous precursor monomer.

11. The apparatus of claim 1, wherein the high frequency source generates semiconductor nanoparticles comprising photoluminescent nanoparticles from the source of continuous precursor monomer.

12. The apparatus of claim 1, wherein the at least two electrodes comprise a central high frequency powered capacitively coupled electrode and two ground electrodes on either side of the central high frequency powered electrode.

13. The apparatus of claim 1, including an orifice and wherein nanoparticles are extracted through the orifice.

14. The apparatus of claim 13, including a supersonic gas jet and wherein nanoparticles are accelerated by the supersonic gas jet.

15. The apparatus of claim 14, wherein a substrate is arrange proximate the supersonic gas jet so that nanoparticles are impacted on the substrate with high velocity to form a nanoparticle film.

16. A plasma reactor for producing nanoparticles, comprising:
    a plasma reactor chamber having a length extending in a flow direction from an inlet to an outlet;
    a source of a continuous gas flow through the plasma reactor chamber along the length of the plasma reactor chamber from the inlet to the outlet which includes a semiconductor containing precursor monomer, the source coupled to the inlet of the plasma reactor chamber;
    at least two electrodes arranged the plasma reactor chamber perpendicular to the flow direction and spaced apart a distance along the length of the plasma reactor, and configured to capacitively couple to gas in the plasma rector chamber wherein the gas flow is through the at least two electrodes; and
    a high frequency voltage source coupled to the at least one of the two electrodes configured to apply a high voltage therebetween and responsively continuously dissociate the semiconductor containing precursor monomer in the plasma reactor chamber to provide precursor species that nucleate and grow into semiconductor nanoparticles, wherein;
    the precursor is primarily converted into nonagglomerated semiconductor nanoparticles and the nanoparticles are carried out of the reactor through the outlet in a continuous fashion; and
    wherein the at least two electrodes comprise a composite sheet disposed between an input chamber and an output chamber, the composite sheet comprising an RF powered electrode and a ground electrode separated by a dielectric medium, wherein the composite sheet defines a matrix of holes extending through the composite sheet.

* * * * *